(12) United States Patent
Mizuno et al.

(10) Patent No.: US 8,081,204 B2
(45) Date of Patent: Dec. 20, 2011

(54) IMAGE RECORDING APPARATUS AND IMAGE RECORDING METHOD

(75) Inventors: Yoshiki Mizuno, Kyoto (JP); Takahide Hirawa, Kyoto (JP)

(73) Assignee: Dainippon Screen MFG Co., Ltd., Kyoto (JP)

( * ) Notice: Subject to any disclaimer, the term of this patent is extended or adjusted under 35 U.S.C. 154(b) by 480 days.

(21) Appl. No.: 12/372,141

(22) Filed: Feb. 17, 2009

(65) Prior Publication Data
US 2009/0244254 A1 Oct. 1, 2009

(30) Foreign Application Priority Data
Mar. 28, 2008 (JP) ................. P2008-85500

(51) Int. Cl.
*B41J 2/435* (2006.01)
(52) U.S. Cl. .................................... 347/249
(58) Field of Classification Search .......... 347/229, 347/234, 235, 239, 240, 248–255
See application file for complete search history.

(56) References Cited

U.S. PATENT DOCUMENTS

| | | | |
|---|---|---|---|
| 5,668,588 A * | 9/1997 | Morizumi et al. | 347/242 |
| 6,208,369 B1 * | 3/2001 | Oren et al. | 347/244 |
| 6,822,670 B2 | 11/2004 | Hirawa | |
| 7,212,225 B2 * | 5/2007 | Sumi et al | 347/239 |
| 7,589,755 B2 * | 9/2009 | Tamaki | 347/239 |
| 2007/0070361 A1 | 3/2007 | Morizono et al. | |

FOREIGN PATENT DOCUMENTS

| | | |
|---|---|---|
| JP | 2004-004525 | 1/2004 |
| JP | 2007-156259 | 6/2007 |
| KR | 10-0869883 | 4/2007 |

OTHER PUBLICATIONS

Korean Office Action issued in Korean Patent Application No. 10-2009-0024911, mailed Nov. 29, 2010.

* cited by examiner

*Primary Examiner* — Hai C Pham
(74) *Attorney, Agent, or Firm* — McDermott Will & Emery LLP

(57) ABSTRACT

In an image recording apparatus, a shift amount for shifting a transition position of an output light amount from a light modulator element is obtained with respect to each pixel value-change point in a pixel line in order to correct displacement of writing. In a case where the shift amount excesses a width corresponding to one pixel on a substrate, a pixel value in the pixel line is altered so that the pixel value-change point moves by the number of pixels of an integer part of a value obtained by dividing the shift amount by the width, and the shift amount corresponding to the pixel value-change point is modified to a value equivalent to a decimal part. It is therefore possible to shift the transition position of the output light amount in excess of the distance corresponding to one pixel in recording an image, to record the image with accuracy.

18 Claims, 19 Drawing Sheets

| CHANGING PIXEL NUMBER | PIXEL VALUE OF CHANGING PIXEL |

| FIRST REFERENCE POSITION ADDRESS | SECOND REFERENCE POSITION ADDRESS | THIRD REFERENCE POSITION ADDRESS | FOURTH REFERENCE POSITION ADDRESS |
|---|---|---|---|

| MODIFIED SHIFT AMOUNT IN CHANGE OF PIXEL VALUES 1→1 | MODIFIED SHIFT AMOUNT IN CHANGE OF PIXEL VALUES 1→2 | MODIFIED SHIFT AMOUNT IN CHANGE OF PIXEL VALUES 1→3 | MODIFIED SHIFT AMOUNT IN CHANGE OF PIXEL VALUES 1→4 |
|---|---|---|---|
| MODIFIED SHIFT AMOUNT IN CHANGE OF PIXEL VALUES 2→1 | MODIFIED SHIFT AMOUNT IN CHANGE OF PIXEL VALUES 2→2 | MODIFIED SHIFT AMOUNT IN CHANGE OF PIXEL VALUES 2→3 | MODIFIED SHIFT AMOUNT IN CHANGE OF PIXEL VALUES 2→4 |
| MODIFIED SHIFT AMOUNT IN CHANGE OF PIXEL VALUES 3→1 | MODIFIED SHIFT AMOUNT IN CHANGE OF PIXEL VALUES 3→2 | MODIFIED SHIFT AMOUNT IN CHANGE OF PIXEL VALUES 3→3 | MODIFIED SHIFT AMOUNT IN CHANGE OF PIXEL VALUES 3→4 |
| MODIFIED SHIFT AMOUNT IN CHANGE OF PIXEL VALUES 4→1 | MODIFIED SHIFT AMOUNT IN CHANGE OF PIXEL VALUES 4→2 | MODIFIED SHIFT AMOUNT IN CHANGE OF PIXEL VALUES 4→3 | MODIFIED SHIFT AMOUNT IN CHANGE OF PIXEL VALUES 4→4 |

| FIRST LEVEL DRIVING VOLTAGE | SECOND LEVEL DRIVING VOLTAGE | THIRD LEVEL DRIVING VOLTAGE | FOURTH LEVEL DRIVING VOLTAGE |
|---|---|---|---|

IMAGE RECORDING APPARATUS AND IMAGE RECORDING METHOD

BACKGROUND OF THE INVENTION

1. Field of the Invention

The present invention relates to a technique for recording an image on a recording medium by irradiation with light.

2. Description of the Background Art

Developed has been a light modulator element of diffraction grating type which is capable of changing the depth of grating by alternately forming fixed ribbons and moving ribbons on a substrate with a semiconductor device manufacturing technique and sagging the moving ribbons relatively to the fixed ribbons. It is proposed that such a diffraction grating is used for light modulation in an image recording apparatus for recording an image on various recording mediums, since the intensities of normally reflected light and diffracted light are changed by changing the depth of grooves on the diffraction grating.

For example, a plurality of light modulator elements of diffraction grating type provided in the image recording apparatus are irradiated with light, and then reflected light (zeroth order light) from light modulator elements in a state where the fixed ribbons and the moving ribbons are positioned at the same height from a base surface is guided to the recording medium and non-zeroth order diffracted light (mainly first order diffracted light) from light modulator elements in a state where the moving ribbons are sagged is blocked, to achieve an image recording on the recording medium.

Japanese Patent Application Laid Open No. 2004-4525 (Document 1) discloses a technique correcting the timing of transition between ON and OFF states of a light modulator element in such an image recording apparatus to correct asymmetry between transition from the OFF state to the ON state and transition from the ON state to the OFF state, difference in characteristics of photosensitive materials, and positional shifts of writing regions caused by difference in length or position of irradiation regions of light modulator elements in a scan direction.

In the image recording apparatus of Document 1, however, since one clock is selected from a group of clocks, which are sequentially shifted by a small time period, within a time period corresponding to one pixel and a driving voltage according to a pixel value of a pixel corresponding to the clock is inputted to a light modulator element, it is not possible to shift a transition timing in excess of the time period corresponding to one pixel (or shift a transition position in excess of the distance corresponding to one pixel).

SUMMARY OF THE INVENTION

The present invention is intended for an image recording apparatus for recording an image on a recording medium by irradiation with light. It is an object of the present invention is to shift a transition position in excess of a distance corresponding to one pixel in recording an image on the recording medium.

In the image recording apparatus according to the present invention, a target image to be recorded on a recording medium contains a plurality of pixel lines each of which has a plurality of pixels arranged in a line direction, each of the plurality of pixel lines consists of a plurality of pixel groups each of which is a series of pixels having same pixel values, the image recording apparatus comprises: a light modulator having a light modulator element; a holding part for holding a recording medium on which the target image is recorded by signal light from the light modulator; a moving mechanism for moving the holding part relatively to the light modulator to move an irradiation position on a recording medium continuously in a scan direction corresponding to the line direction, the irradiation position being irradiated with light from the light modulator element; an operation part for obtaining a shift amount for shifting a transition position of an output light amount outputted from the light modulator element with respect to each pixel value-change point which is a position between adjacent two pixel groups in each pixel line, in order to correct displacement of writing of a pixel group, wherein in a case where the shift amount excesses a width corresponding to one pixel in the scan direction on a recording medium, the operation part alters a pixel value(s) of a pixel(s) in the each pixel line so that the each pixel value-change point moves in the line direction by a number of pixels of an integer part of a calculated value which is obtained by dividing the shift amount by the width, and the operation part modifies the shift amount corresponding to the each pixel value-change point to a value equivalent to a decimal part of the calculated value; and a control part for controlling the light modulator on the basis of the target image after alteration and the shift amount after modification, in synchronization with the moving mechanism.

According to the present invention, it is possible to shift a transition position in excess of a distance corresponding to one pixel in recording an image on the recording medium.

According to a preferred embodiment of the present invention, the shift amount before modification at each pixel value-change point is obtained by referring to a combination of two pixel values of the adjacent two pixel groups in the operation part, and the operation part comprises: a first table memory for storing a pixel processing table which represents a movement amount of a pixel value-change point relative to each of a plurality of combinations of two pixel values; an image altering part for acquiring a movement amount of each pixel value-change point in each pixel line by referring to the pixel processing table by a combination of two pixel values in each pixel value-change point to move each pixel value-change point in the line direction; a second table memory for storing a modified shift amount table which represents a modified shift amount relative to each of the plurality of combinations of two pixel values; and a shift amount obtaining part for obtaining a modified shift amount relative to each pixel value-change point in each pixel line by referring to the modified shift amount table by the combination of two pixel values in each pixel value-change point. In this manner, it is possible to easily achieve shift of the transition position excessing the distance corresponding to one pixel by referring to the pixel processing table and the modified shift amount table.

According to another preferred embodiment of the present invention, a base clock is generated in the control part every time when the irradiation position on a recording medium moves in the scan direction by a constant distance corresponding to a predetermined number of pixels arranged in each pixel line of the target image, and transition of an output light amount outputted from the light modulator element is permitted only once in a base clock period between adjacent two base clocks, and in a case where a number of pixels in a minimum pixel group, where a number of pixels is minimum, out of a plurality of pixel groups each of which is a series of pixels having same pixel values in the line direction in the target image after alteration, is smaller than the predetermined number of pixels, the operation part shortens the constant distance to a distance corresponding to the number of pixels in the minimum pixel group. As a result, it is possible to record an image with accuracy in the image recording apparatus, where transition of the output light amount outputted from the light modulator element is permitted only once in the base clock period.

According to an aspect of the present invention, the shift amount before modification is a value which is obtained by increasing or decreasing a distance from a half of a width corresponding to one pixel in the scan direction on a recording medium, the distance being based on displacement of writing of a pixel group. It is thereby possible to easily move the transition position of the output light amount outputted from the light modulator element to the both sides in the scan direction.

According to another aspect of the present invention, the target image is inputted to the operation part as run-length data, and lengths of run-lengths in the run-length data are changed in moving each pixel value-change point. It is thereby possible to perform movement of the pixel value-change point easily.

The present invention is also intended for an image recording method of recording an image on a recording medium by irradiation with light while moving an irradiation position on the recording medium continuously in a scan direction, the irradiation position being irradiated with light emitted from a light modulator element of a light modulator.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a view showing a structure of converted pixel data;
FIG. 10 is a view showing a reference position address table;
FIG. 11 is a view showing a modified shift amount table;
FIG. 12 is a view showing a driving voltage table.

DESCRIPTION OF THE PREFERRED EMBODIMENTS

Figure 1:
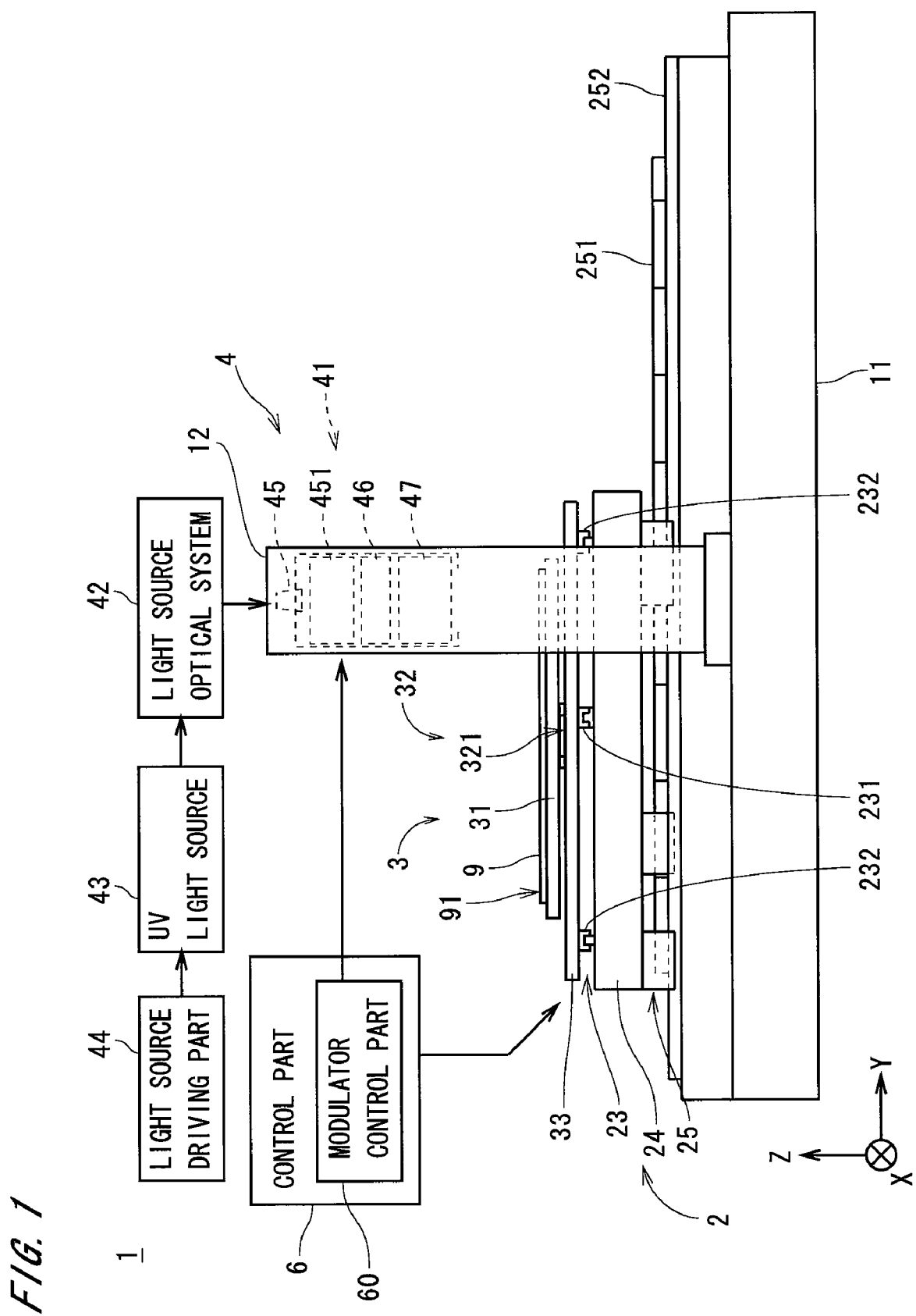
FIG. 1 is a side view showing a constitution of an image recording apparatus in accordance with the first preferred embodiment.
Figure 2:
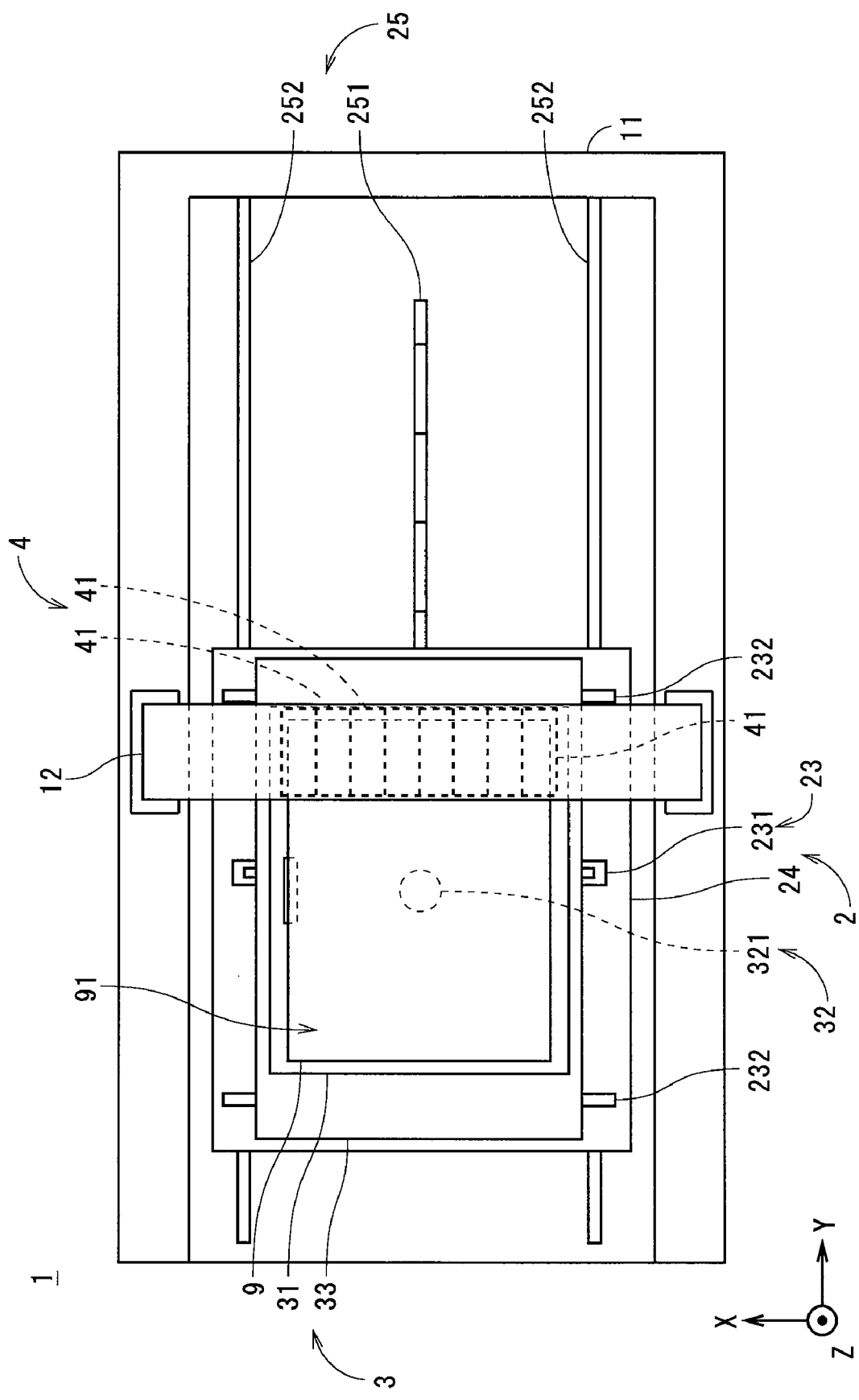
FIG. 2 is a plan view of the image recording apparatus.

FIG. 1 is a side view of an image recording apparatus 1 in accordance with the first preferred embodiment of the present invention, and FIG. 2 is a plan view of the image recording apparatus 1. The image recording apparatus 1 is an apparatus for recording an image by applying (irradiating) light onto photosensitive material provided on a glass substrate (hereinafter, simply referred to as "substrate") used for a liquid crystal display (the apparatus is also called as a pattern writing apparatus). As shown in FIGS. 1 and 2, the image recording apparatus 1 has a substrate holding part 3 for holding a substrate 9 having a layer of photosensitive material formed on a main surface 91 on the (+Z) side (the main surface 91 is referred to as "upper surface 91"), a holding part moving mechanism 2 which is provided on a base part 11 and moves the substrate holding part 3 in the X direction and the Y direction which are perpendicular to the Z direction, a flame 12 which is fixed on the base part 11 over the substrate holding part 3 and the holding part moving mechanism 2, and a light irradiation part 4 which is attached to the flame 12 and applies (irradiates) modulated light onto photosensitive material formed on the substrate 9. The image recording apparatus 1 also has a control part 6 for controlling each of constituent elements such as the holding part moving mechanism 2 and the light irradiation part 4, as shown in FIG. 1.

The substrate holding part 3 has a stage 31 on which the substrate 9 is placed, a supporting plate 33 for rotatably supporting the stage 31, and a stage rotation mechanism 32 for rotating the stage 31 above the supporting plate 33 around a rotation axis 321 which is perpendicular to the upper surface 91 of the substrate 9.

The holding part moving mechanism 2 has a sub scan mechanism 23 for moving the substrate holding part 3 in the X direction (hereinafter, referred to as "sub scan direction") of FIGS. 1 and 2, a base plate 24 for supporting the supporting plate 33 with interposing the sub scan mechanism 23, and a main scan mechanism 25 for moving the substrate supporting part 3 together with the base plate 24 continuously in the Y direction (hereinafter, referred to as "main scan direction") which is perpendicular to the X direction. In the image recording apparatus 1, the substrate supporting part 3 is moved by the supporting part moving mechanism 2 in the main scan direction and the sub scan direction which are parallel to the upper surface 91 of the substrate 9.

Below the supporting plate 33 (i.e., on the (−Z) side), the sub scan mechanism 23 has a linear motor 231 extending in the sub scan direction which is parallel to a main surface of the stage 31 and perpendicular to the main scan direction and a pair of linear guides 232 extending in the sub scan direction on the (+Y) side and the (−Y) side of the linear motor 231, as shown in FIGS. 1 and 2. Below the base plate 24, the main scan mechanism 25 has a linear motor 251 extending in the main scan direction which is parallel to the main surface of the stage 31, a pair of air sliders 252 extending in the main scan direction on the (+X) side and the (−X) side of the linear motor 251, and a not-shown linear scale.

As shown in FIG. 2, the light irradiation part 4 has a plurality of (eight in the preferred embodiment) optical heads 41 which are arranged along the sub scan direction at an equal pitch and attached to the flame 12. As shown in FIG. 1, the light irradiation part 4 also has a light source optical system 42 which is connected to each optical head 41, a UV light source 43 for emitting UV (ultraviolet) light, and a light source driving part 44. The UV light source 43 is a solid laser, and UV light with a wavelength of, e.g., 355 nm is emitted from the UV light source 43 by driving the light source driving part 44 and the light is directed to the optical head 41 through the light source optical system 42.

Each optical head 41 has an emission part 45 for emitting the light from the UV light source 43 downwards, an optical system 451 which reflects the light from the emission part 45 and directs to a spatial light modulator 46, the spatial light modulator 46 for modulating the light which is applied from the emission part 45 through the optical system 451 and reflecting thereon, and an optical system 47 for directing modulated light by the spatial light modulator 46 to the photosensitive material which is provided on the upper surface 91 of the substrate 9.

Figure 3:
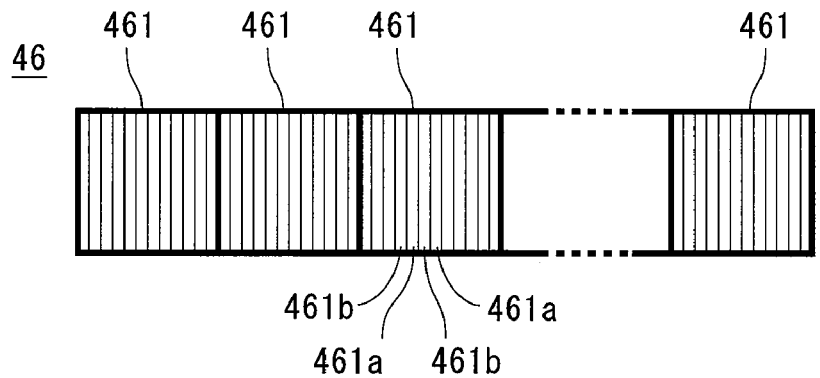
FIG. 3 is a view showing a spatial light modulator.

FIG. 3 is an enlarged view of the spatial light modulator 46. As shown in FIG. 3, the spatial light modulator 46 has a plurality of light modulator elements 461 of diffraction grating type, which direct the light from the UV light source 43 to the upper surface 91 of the substrate 9 through the emission part 45. The light modulator element 461 is manufactured with the semiconductor device manufacturing technique and is a diffraction grating whose grating depth is changeable. In each light modulator element 461, a plurality of moving ribbons 461*a* and a plurality of fixed ribbons 461*b* are alternately arranged in parallel, and the plurality of moving ribbons 461*a* are individually vertically movable with respect to a base surface therebehind and the plurality of fixed ribbons 461*b* are fixed with respect to the base surface. As the light modulator element with diffraction grating structure, for example, the GLV (Grating Light Valve) (trademarked by Silicon Light Machine, Sunnyvale, Calif.) is well known.

Figure 4A:
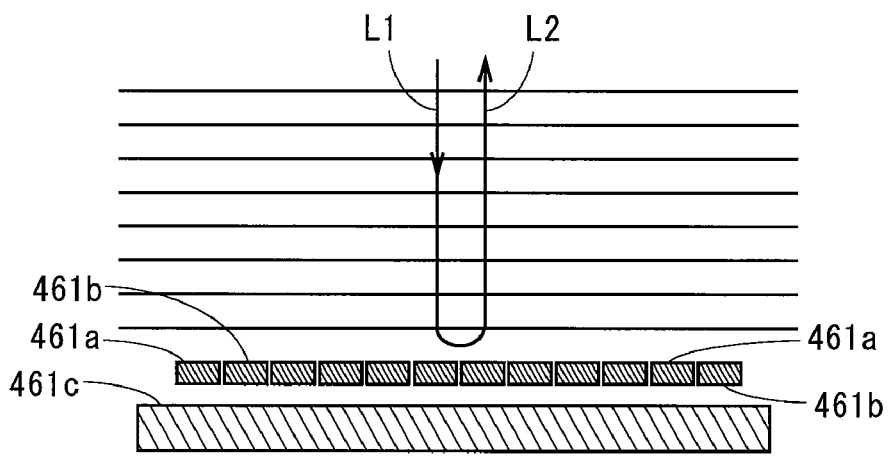
FIGS. 4A and 4B are views each showing a cross section of a light modulator element.
Figure 4B:
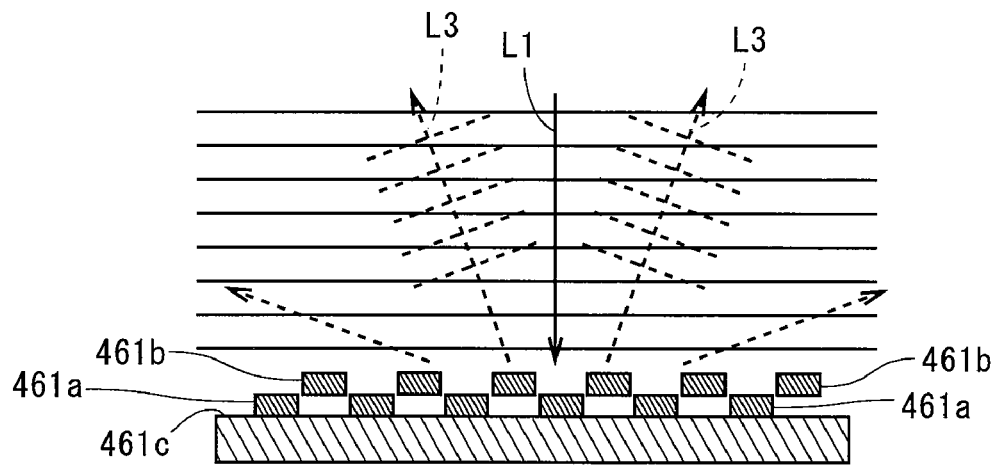

FIGS. 4A and 4B are views each showing a cross section of the light modulator element 461 at a plane perpendicular to the moving ribbons 461*a* and the fixed ribbons 461*b*. As shown in FIG. 4A, when the moving ribbons 461*a* and the fixed ribbons 461*b* are positioned at the same height from a base surface 461*c* (in other words, the moving ribbons 461 a do not sag), a surface of the light modulator element 461 becomes flush and reflected light of incident light L1 is guided out as zeroth order light (normally reflected light) L2. On the other hand, as shown in FIG. 4B, when the moving ribbons 461*a* sag towards the base surface 461*c* with respect to the fixed ribbons 461*b* and the difference of heights between the moving ribbons 461*a* and the fixed ribbons 461*b* is made to a predetermined value, the moving ribbons 461*a* serve as bottom surfaces of grooves of the diffraction grating, and first order diffracted light L3 (further, high-order diffracted light) is guided out from the light modulator element 461 and the zeroth order light L2 disappears. In the actual light modulator element 461, the difference of heights between the moving ribbons 461*a* and the fixed ribbons 461*b* is changeable among a plurality of heights so that intensity of the zeroth order light L2 is changed among a plurality of intensities, and multi-level light modulation using the diffraction grating is performed.

In the light irradiation part 4 shown in FIG. 1, the light from the UV light source 43 becomes linear light (light where a section of luminous flux has a linear shape) through the light source optical system 42, and the light is applied onto the plurality of moving ribbons 461*a* and the plurality of fixed ribbons 461*b* (see FIGS. 4A and 4B) which are arranged linearly in the spatial light modulator 46, through the emission part 45. In the light modulator element 461, if one moving ribbon 461*a* and one fixed ribbon 461*b* which are adjacent each other are one ribbon pair, three or more ribbon pairs correspond to one pixel of a pattern to be written. Naturally, the light modulator element 461 may be one ribbon pair which corresponds to one pixel.

In the light modulator element 461, the moving ribbons 461*a* of the ribbon pairs corresponding to each pixel of the pattern are individually controlled on the basis of a signal outputted from a modulator control part 60 which is connected to each spatial light modulator 46, and the ribbon pairs corresponding to each pixel can be changed (switched) among a plurality of states where an output light amount (intensity) of emitted zeroth order light is changed among a plurality of output light amounts. The zeroth order light emitted from the light modulator element 461 is directed to the optical system 47, and non-zeroth order diffracted light (mainly first order diffracted light ((+1)st order diffracted light and (−1)st order diffracted light)) is directed to different directions from the optical system 47. The first order diffracted light is blocked by a not-shown light blocking part so as not to be stray light.

The zeroth order light from the light modulator element 461 is directed to the upper surface 91 of the substrate 9 through the optical system 47 and thereby, modulated light is applied to each of a plurality of irradiation positions which are arranged in the X direction (i.e., the sub scan direction) on the upper surface 91 of the substrate 9. As discussed above, the ribbon pairs of the light modulator element 461 corresponding to each pixel can apply light to the substrate 9 at multiple gray levels (including a gray level where light for writing is not applied to the substrate 9).

In the image recording apparatus 1 shown in FIGS. 1 and 2, modulated light is applied from the light modulator elements 461 in the light irradiation part 4 to the substrate 9 which is moved in the main scan direction by the main scan mechanism 25 in the holding part moving mechanism 2. In other words, the main scan mechanism 25 serves as an irradiation position moving mechanism for moving a position of an irradiation region (i.e., an irradiation position) on the substrate 9 continuously in the main scan direction relatively to the substrate 9, the irradiation region being irradiated with the light which is directed from the light modulator elements 461 to the substrate 9. In the image recording apparatus 1, the irradiation position on the substrate 9 may be moved in the main scan direction by moving the optical head 41 in the main scan direction, without moving the substrate 9. In the image recording apparatus 1, modulation of the light from the light modulator elements 461 is controlled by the modulator control part 60 in the control part 6 and thereby, a pattern representing an image to be recorded on the substrate 9 (the image is hereinafter referred to as "target image") is recorded on the substrate 9.

Figure 5:
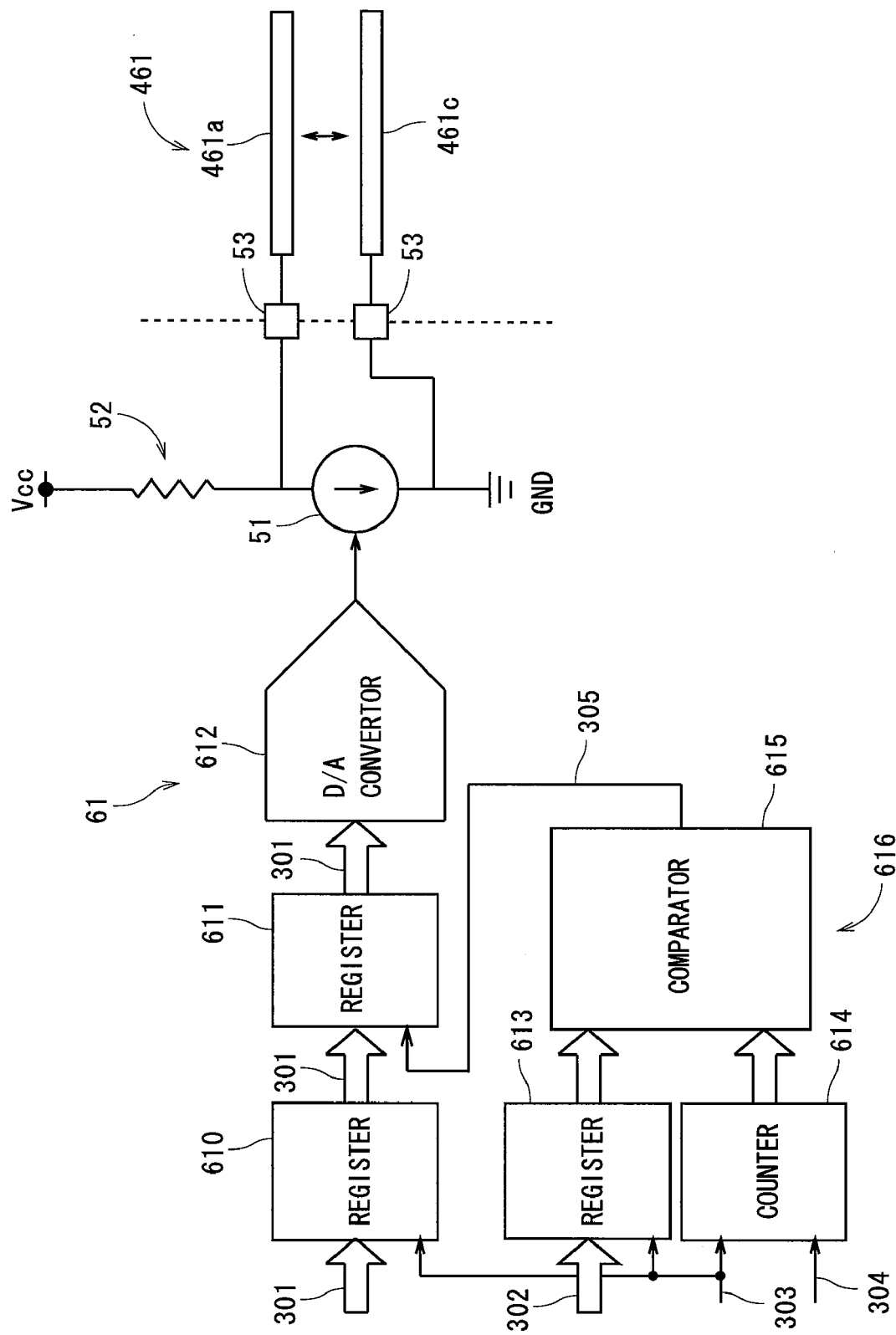
FIG. 5 is a view showing a constitution of a part of a driving element.

FIG. 5 is a view showing a constitution of a part of the modulator control part 60 and shows a part of an element for driving each light modulator element 461 in the modulator control part 60 (the element is hereinafter referred to as "driving element 61"). The driving element 61 has registers 610, 611, a shift part 616, a D/A convertor 612, and a circuit for converting an output from the D/A convertor 612 into an actual driving voltage of the light modulator element 461. The shift part 616 has a register 613, a counter 614, and a comparator 615.

The modulator control part 60 further has a not-shown clock generation part, and a signal outputted from a linear scale of the main scan mechanism 25 is inputted to the clock generation part. As shown in the upper part of FIG. 6, every time when the irradiation position of light from each light modulator element 461 on the substrate 9 moves in the main scan direction (the Y direction) by a constant distance (a distance which is set in later-discussed image recording and hereinafter referred to as "set distance"), a base clock 303 is generated in the clock generation part and inputted to the register 610, the register 613 and the counter 614 in the shift part 616 shown in FIG. 5. In FIG. 5, base clocks which are sequentially inputted to the registers 610, 613 and the counter 614 are shown by arrows 303 (the same is applied in a delay clock 304, driving voltage data 301, a shift delay number data 302, and a shifted clock 305, which are discussed later).

Figure 6:
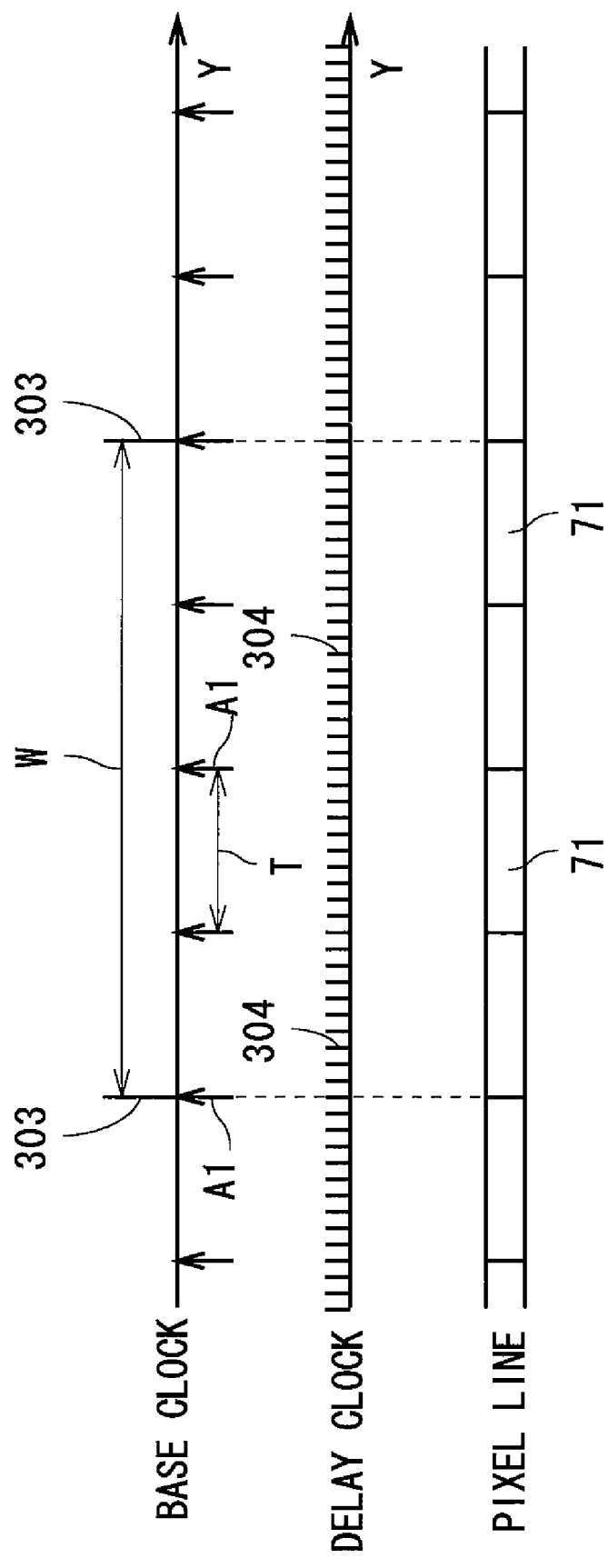
FIG. 6 is a view showing base clocks and delay clocks.

In the clock generation part, a delay clock 304 is generated every time when the irradiation position on the substrate 9 moves by a distance which is obtained by equally dividing the set distance by a predetermined number (for example, the distance is 10 nanometers (nm)) and the delay clock 304 is inputted to the counter 614, as shown in the middle part of FIG. 6. In each of the upper part and the middle part of FIG. 6, the horizontal axis can be regarded as time (the same as in FIG. 9, FIGS. 14 to 16, FIGS. 18, 19, 22 and 23, which are discussed later).

Driving voltage data 301 representing a target voltage where the actual driving voltage gradually changes with time and finally reaches the target voltage (the target voltage is hereinafter referred to as "target driving voltage") is inputted to the register 610 of FIG. 5 in response to the base clock 303 in turn, and the driving voltage data 301 is outputted from the register 610 to the register 611 in synchronization with the base clock 303. Shift delay number data 302 used for adjusting a switching position (switching timing) of the light modulator element 461 is inputted to the resister 613 in the shift part 616 in response to the base clock 303 in turn.

The shift delay number data 302 is inputted from the register 613 to the comparator 615 in synchronization with the base clock 303. Every time when the delay clock 304 is inputted to the counter 614, a count number of the delay clock 304 in the counter 614 is outputted to the comparator 615. When a value indicated by the shift delay number data 302 coincides with the count number outputted from the counter 614, a clock (hereinafter, referred to as "shifted clock") 305 which is delayed relative to the base clock 303 is outputted from the comparator 615 to the register 611. With this operation, an analog signal of the driving voltage data 301 is outputted from the register 611 through the D/A convertor 612. The count number of the delay clock 304 in the counter 614 is reset every time the base clock 303 is inputted.

The driving voltage data 301 of each shifted clock 305 corresponds to the target driving voltage in driving the light modulator element 461 once, and an output from the D/A convertor 612 is inputted to a current source 51 and further converted into current. One end of the current source 51 is connected to the side of high potential Vcc through a resistance 52 and the other end is grounded.

Both ends of the current source 51 are connected to the moving ribbons 461a of the light modulator element 461 and the base surface 461c through connecting pads 53. When the driving voltage data 301 is converted into the current through the D/A converter 612 and the current source 51, it is further converted into an actual driving voltage between the both connecting pads 53 by a voltage drop of the resistance 52. As discussed above, the driving element 61 can shift (adjust) the switching position of the light modulator element 461 from a position corresponding to the base clock 303 on the basis of the shift delay number data 302, where the distance between adjacent two delay clocks 304 is the minimum resolution.

Since there is stray capacitance between the connecting pads 53, the actual driving voltage between the connecting pads 53 changes in accordance with the time constant between the connecting pads 53 and gradually goes toward the target driving voltage.

Figure 7:
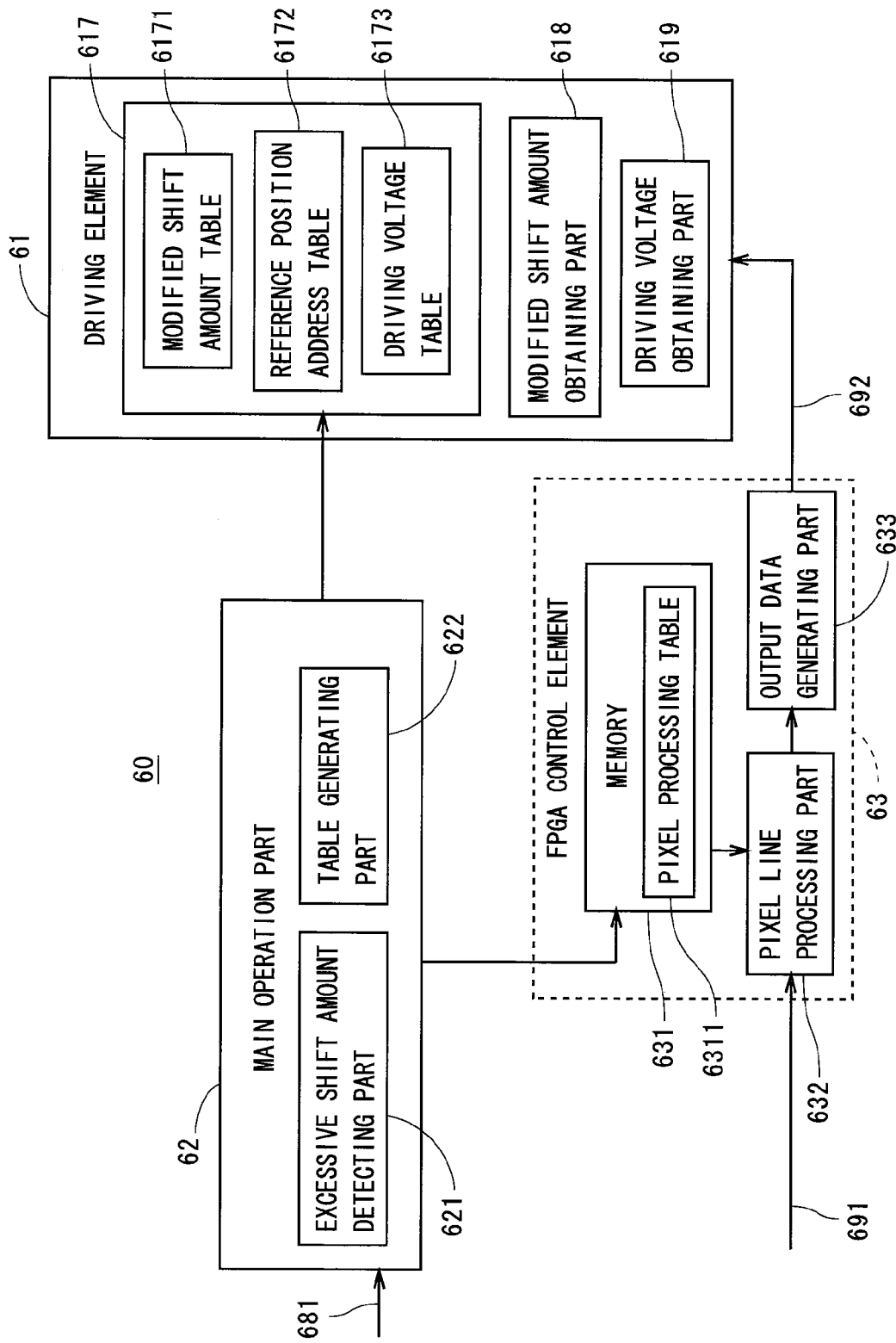
FIG. 7 is a block diagram showing a constitution of a modulator control part.

FIG. 7 is a block diagram showing a constitution of the modulator control part 60. The modulator control part 60 has a main operation part 62 having a CPU for performing various computations and a memory for storing various pieces of information and an FPGA (Field Programmable Gate Array) control element 63 (shown by a broken-line rectangle in FIG. 7) which is a programmable electric circuit, in addition to the driving element 61 discussed above. Actually, in the modulator control part 60, though one driving element 61 and one FPGA control element 63 are provided for each light modulator element 461, a driving element 61 and an FPGA control element 63 which correspond to one light modulator element 461 are only shown in FIG. 7.

The main operation part 62 has a table generating part 622 for generating various tables used in image recording and an excessive shift amount detecting part 621 for detecting a condition for generating a table in generation of the table, which is discussed later. In the FPGA control element 63, implemented are functions of a memory 631 for storing a pixel processing table 6311 used in alteration of the target image (processing of a pixel(s)), a pixel line processing part 632 for altering a pixel value(s) of a pixel(s) in the target image by referring to the pixel processing table 6311, and an output data generating part 633 for converting an image after alteration into data format for the driving element 61.

Each driving element 61 has a modified shift amount obtaining part 618 for obtaining the shift delay number data 302, a driving voltage obtaining part 619 for obtaining the driving voltage data 301, and a memory 617. A modified shift amount table 6171 which is prepared for each light modulator element 461, a reference position address table 6172 which is common in all the light modulator elements 461, and a driving voltage table 6173 representing target driving voltages corresponding to output light amounts in multiple gray levels in writing are inputted from the main operation part 62 to the memory 617 and stored therein.

In the target image to be recorded in the image recording apparatus 1, a plurality of pixels are arranged in a line direction (i.e., column direction) corresponding to the main scan direction and a row direction corresponding to the sub scan direction. In later-discussed image recording (pattern writing), the target image contains a plurality of pixel lines each of which has a plurality of pixels arranged in the line direction, and writing on one pixel line is performed by each light modulator element 461. Each pixel line consists of a plurality of pixel groups each of which is a series of pixels having the same pixel values in the line direction (i.e., each pixel line consists of a plurality of pixel groups each of which is a group of two or more pixels), and a position between two adjacent pixel groups in the pixel line is a pixel value-change point representing transition of an output light amount which is applied from the light modulator element 461 onto the irradiation region. In the present preferred embodiment, the target image is a quaternary image of 1 to 4 but may be naturally an image with five or more gray levels or an image with a gray level of two or three.

Data of a pixel line (hereinafter, referred to as "pixel line data") 691 corresponding to each light modulator element 461 is inputted to the pixel line processing part 632, which is connected to the driving element 61 of the light modulator element 461, as run-length data, and the pixel line data 691 is processed by referring to the pixel processing table 6311, as discussed later. In the output data generating part 633, pixel line data 691 after processing is converted into a data format for the driving element 61 and outputted to the driving element 61 as converted pixel data 692, every time when the base clock 303 is generated.

Like in the upper part of FIG. 6 showing the base clocks 303 and the lower part of FIG. 6 showing pixels of one pixel line, two or more pixels 71 (four pixels 71 in the example of the lower part of FIG. 6) in each pixel line of the target image become an object of writing control in a period between adjacent two base clocks 303 (the period is referred to as "base clock period") in the image recording apparatus 1. In other words, the number of pixels to be an object of writing control in the base clock period is considered as the pixel count between the base clocks, and the set distance where the irradiation position of light from the light modulator element 461 moves in the main scan direction in the base clock period is the distance corresponding to pixels 71 of the pixel count between the base clocks (the distance indicated by an arrow W in the upper part of FIG. 6). In the upper and lower parts of FIG. 6, a position corresponding to the beginning of each pixel 71 of the target image in the main scan direction (a position indicated by a reference sign A1) is referred to as a "reference position" of the pixel, and a distance between adjacent two reference positions is referred to as a "reference distance" (i.e., the distance is a distance obtained by dividing the set distance by the pixel count between the base clocks, and it can be regarded as the logical minimum resolution in writing) in the following description. In the lower part of FIG. 6, the reference distance is represented by a reference sign T.

In the image recording apparatus 1, since the shifted clock 305 is outputted only once in the base clock period in the constitution of the driving element 61 shown in FIG. 5, transition of the output light amount outputted from the light modulator element 461 is allowable only once in the base clock period. The converted pixel data 692 which is outputted correspondingly to the base clock 303 represents an ordinal number of a pixel whose pixel value changes from the immediately prior pixel and represents a pixel value of the pixel in pixels of the pixel count between the base clocks in the base clock period (hereinafter, the ordinal number and the pixel value are referred to as "changing pixel number" and "pixel value of changing pixel"), as shown in FIG. 8.

Figure 9:
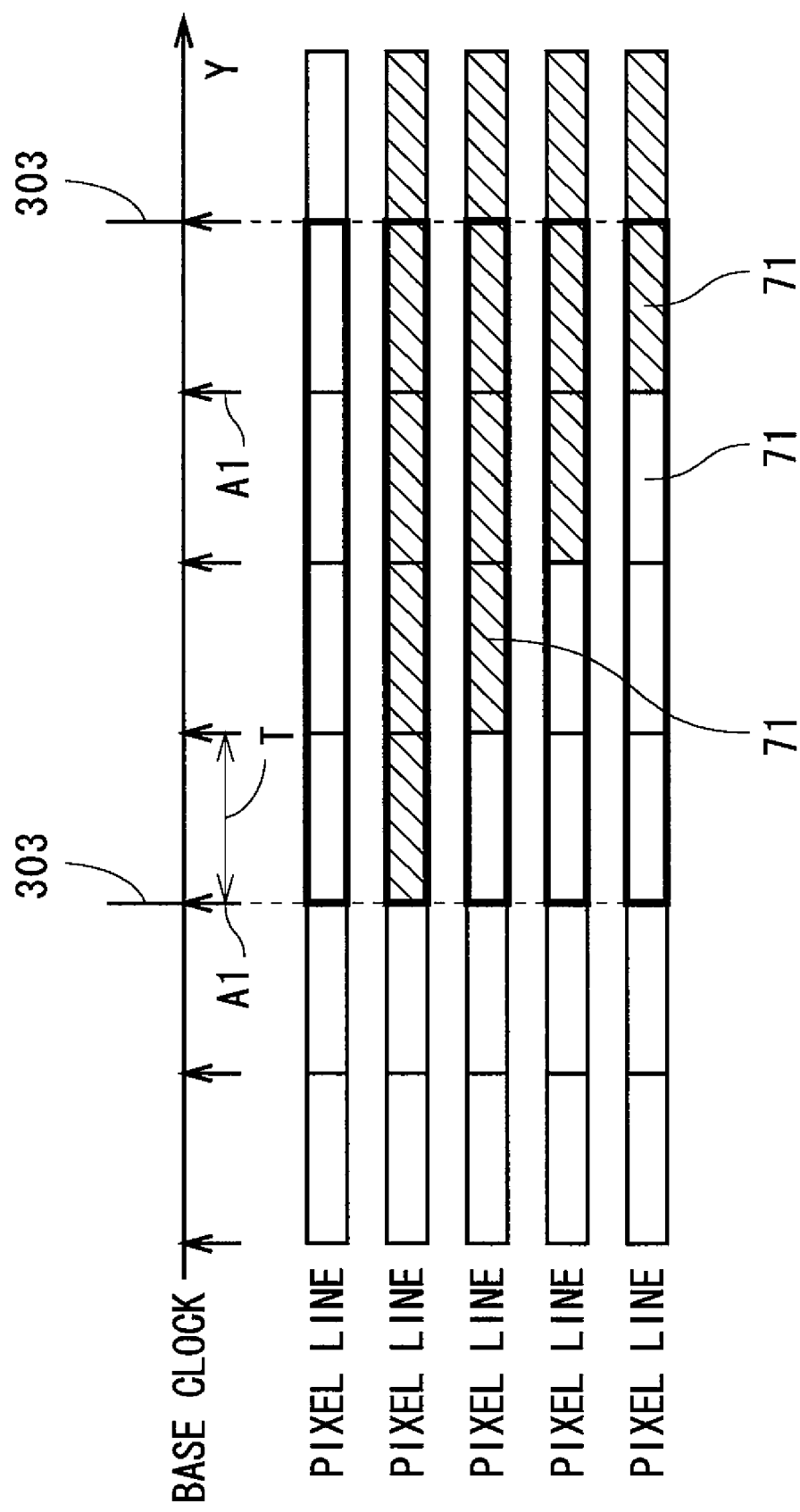
FIG. 9 is a view for explaining the converted pixel data.

For example, in a case where the pixel count between the base clocks is 4 and a pixel value changes from 1 to 2 between the third pixel 71 and the fourth pixel 71 in four pixels 71 (pixels 71 surrounded by thick-line rectangles in the lowest pixel line of FIG. 9) in a certain base clock period as shown in the lowest pixel line of FIG. 9 (A pixel 71 whose pixel value is 1 is represented by a white rectangle and a pixel 71 whose pixel value is 2 is represented by a hatched rectangle in the lowest pixel line of FIG. 9. The same is applied from the uppermost pixel line to the fourth pixel line of FIG. 9 and FIGS. 14 to 16, and FIGS. 18 and 19), the changing pixel number and the pixel value of changing pixel are 4 and 2. As shown in the fourth pixel line of FIG. 9, in a case where a pixel value changes from 1 to 2 between the second pixel 71 and the third pixel 71, the changing pixel number and the pixel value of changing pixel are 3 and 2, and as shown in the third pixel line of FIG. 9, in a case where a pixel value changes from 1 to 2 between the first pixel 71 and the second pixel 71, the changing pixel number and the pixel value of changing pixel are both 2.

As shown in the second pixel line of FIG. 9, in a case where a pixel value changes from 1 to 2 between the first pixel 71 and the fourth pixel 71 in the immediately prior base clock, the changing pixel number and the pixel value of changing pixel are 1 and 2, and as shown in the uppermost pixel line of FIG. 9, in a case where a pixel value does not change, the changing pixel number is 1 and the pixel value of changing pixel is the same as the pixel value of the last pixel in the immediately prior base clock period. The changing pixel number can be regarded as a logical coordinate value where the reference distance T is unit.

FIG. 10 is a view showing the reference position address table 6172. The reference position address table 6172 shown in FIG. 10 is a table representing a distance in the main scan direction from a position where the immediately prior base clock 303 is generated to a reference position of each of the first to fourth pixels, as a count number of the delay clock 304 (the distance is hereinafter referred to as "reference position address") (see the uppermost part of FIG. 9). In FIG. 10, the reference position addresses of the first to fourth pixels are described as the "first reference position address", the "second reference position address", the "third reference position address", and the "fourth reference position address", respectively.

FIG. 11 is a view showing the modified shift amount table 6171. The modified shift amount table 6171 is generated by modifying a later-discussed correction table and shows a shift amount relative to each of a plurality of combinations of two pixel values (the shift amount is a value which is obtained by modifying (altering) a value derived from a later-discussed correction table and hereinafter, referred to as "modified shift amount"). Actually, the modified shift amount is represented by the count number of the delay clock 304. In FIG. 11, a modified shift amount for a combination of a pixel value M and a pixel value N is described as a "modified shift amount in change of pixel values M→N" (where M and N are 1 to 4). The modified shift amount is smaller than the count number corresponding to the distance between adjacent two reference positions (i.e., the reference distance T).

In the modified shift amount obtaining part 618 of FIG. 7, one reference position address is specified by referring to the reference position address table 6172 of FIG. 10 by the changing pixel number of the converted pixel data 692 which is inputted from the output data generating part 633 every base clock 303. In the modified shift amount obtaining part 618, the pixel value of changing pixel of the converted pixel data 692 which is inputted in the immediately prior base clock 303 is stored, and one modified shift amount is specified by referring to the modified shift amount table 6171 of FIG. 11 by the pixel value of changing pixel in the immediately prior base clock 303 and the pixel value of changing pixel in the present base clock 303. A value which is a sum of the specified reference position address and the modified shift amount (both of which are represented as the count numbers of the delay clocks 304 as discussed above) is obtained as a shift delay number, and the shift delay number is inputted to the register 613 of the shift part 616 in FIG. 5 as shift delay number data 302.

FIG. 12 is a view showing the driving voltage table 6173. The driving voltage table 6173 is a table showing target driving voltages which correspond to a plurality of pixel values, respectively. In the driving voltage obtaining part 619 of FIG. 7, a driving voltage corresponding to the pixel value of changing pixel is specified by referring to the driving voltage table 6173 by the pixel value of changing pixel of the converted pixel data 692. In FIG. 12, the driving voltages corresponding to the pixel values of changing pixels 1 to 4 are described as the "first level driving voltage", the "second level driving voltage", the "third level driving voltage", and the "fourth level driving voltage", respectively. The specified driving voltage is inputted to the register 610 of FIG. 5 as the driving voltage data 301.

As discussed above, the driving voltage data 301 and the shift delay number data 302 are generated from the converted pixel data 692 in the driving element 61 of FIG. 7 and it is therefore possible to transit the output light amount outputted from the light modulator element 461 to a level corresponding to the pixel value of changing pixel and to shift (adjust) the transition position of the output light amount. The details of the pixel processing table 6311 and the modified shift amount table 6171 will be described later.

Next, discussion will be made on an operation for recording an image on the substrate 9 in the image recording apparatus 1 by referring to FIG. 13. In the image recording apparatus 1, first, a correction table is prepared for each light modulator element 461 by an operator and inputted to the main operation part 62 in FIG. 7 (Step S11). The correction table is shown by an arrow 681 in FIG. 7.

The correction table is a table for showing a shift amount for shifting a transition position of an output light amount outputted from each light modulator element 461 with respect to each pixel value-change point in a pixel line corresponding to the light modulator element 461, in order to correct displacement of a position (i.e., displacement of writing) of a border between two areas on the substrate 9 in the main scan direction, the two areas corresponding to two pixel groups sandwiching the pixel value-change point (the two areas where a pattern corresponding to the two pixel groups is formed). The reason for displacement of writing is that the time period until the state of the moving ribbons 461a is stabilized in changing an amount of sagging is different depending on combinations of pixel values of the two pixel groups sandwiching the pixel value-change point or that the length or the position (irradiation position) of the irradiation region of the light modulator element 461 in the main scan direction is different from that of other light modulator element 461, or the like. The correction table is obtained by actually writing a pattern, which extends in the sub scan direction, on a dummy substrate, or by providing a light detection part on the stage 31 and measuring a length and a position in the main scan direction of the irradiation region of the light emitted from each of all the light modulator elements 461.

In the correction table shown in Table 1, a normal shift amount, a linewidth correction shift amount, and a positional correction shift amount are set for each of all the combinations of a pixel value of a pixel which is adjacent to a watched pixel on the front side (i.e., the pixel is immediately prior to the watched pixel) and a pixel value of the watched pixel (in Table 1, a pixel value of the pixel which is adjacent to the watched pixel on the front side and the pixel value of the watched pixel are described as an "adjacent pixel value" and a "present pixel value"). Although Table 1 only shows cases where combinations of the "adjacent pixel values" and the "present pixel values" are "1 and 1", "1 and 2", "2 and 1", and "2 and 2", actually, the "normal shift amount", the "linewidth correction shift amount", and the "positional correction shift amount" are set for each of the combinations of the "3" and the "4" with respect to each of "adjacent pixel value" and "present pixel value".

TABLE 1

| | Adjacent pixel value | | | |
|---|---|---|---|---|
| | 1 | 1 | 2 | 2 |
| | Present pixel value | | | |
| | 1 | 2 | 1 | 2 |
| Normal shift amount | +($\frac{1}{2}$)T | +($\frac{1}{2}$)T | +($\frac{1}{2}$)T | +($\frac{1}{2}$)T |
| Linewidth correction shift amount | 0 | +($\frac{1}{3}$)T | −($\frac{1}{3}$)T | 0 |
| Positional correction shift amount | +($\frac{1}{3}$)T | +($\frac{1}{3}$)T | +($\frac{1}{3}$)T | +($\frac{1}{3}$)T |

Figure 14:
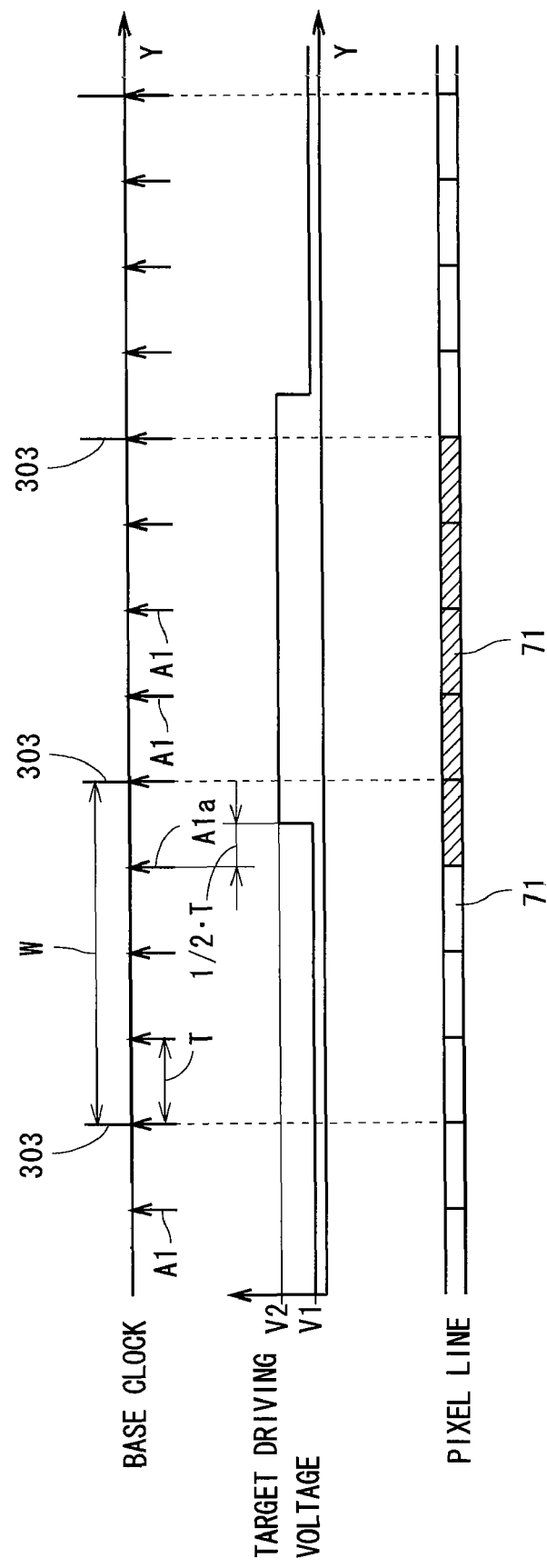
FIG. 14 is a view for explaining a normal shift amount.

FIG. 14 is a view for explaining a normal shift amount in the correction table.

The upper part of FIG. 14 represents a base clock 303, the middle part represents a target driving voltage, and the lower part represents a pixel line. As shown in the upper part and the lower part of FIG. 14, the pixel count between the base clocks is 4, and in the upper part of FIG. 14, the reference distance obtained by dividing the set distance W by the pixel count between the base clocks is represented by an arrow T similarly to the upper part of FIG. 6.

The normal shift amount is used, even in a case where it is not necessary to correct the above-discussed displacement of writing, for moving the transition position of the output light amount from a position corresponding to the pixel value-change point toward the front side in a relative movement direction of the irradiation position to the substrate 9 (the front side in movement of the main scan direction and is the right side of FIG. 14). For example, in the example shown in the middle part and the lower part of FIG. 14, the transition position for changing the target driving voltage relative to the light modulator element 461 from the first level driving voltage V1 corresponding to the pixel value 1 to the second level driving voltage V2 corresponding to the pixel value 2, is moved relatively to a position of the pixel value-change point from the white pixel 71 of the pixel value 1 to the hatched pixel 71 of the pixel value 2 (i.e., the position is the reference position A1a of the first pixel 71 in the pixel group of the pixel value 2), by the distance of ½ times the reference distance T which is the normal shift amount. Though the correction table is prepared for each of all the light modulator elements 461 as discussed earlier, the normal shift amount is equal in all the combinations of pixel values in all the correction tables.

Figure 15:
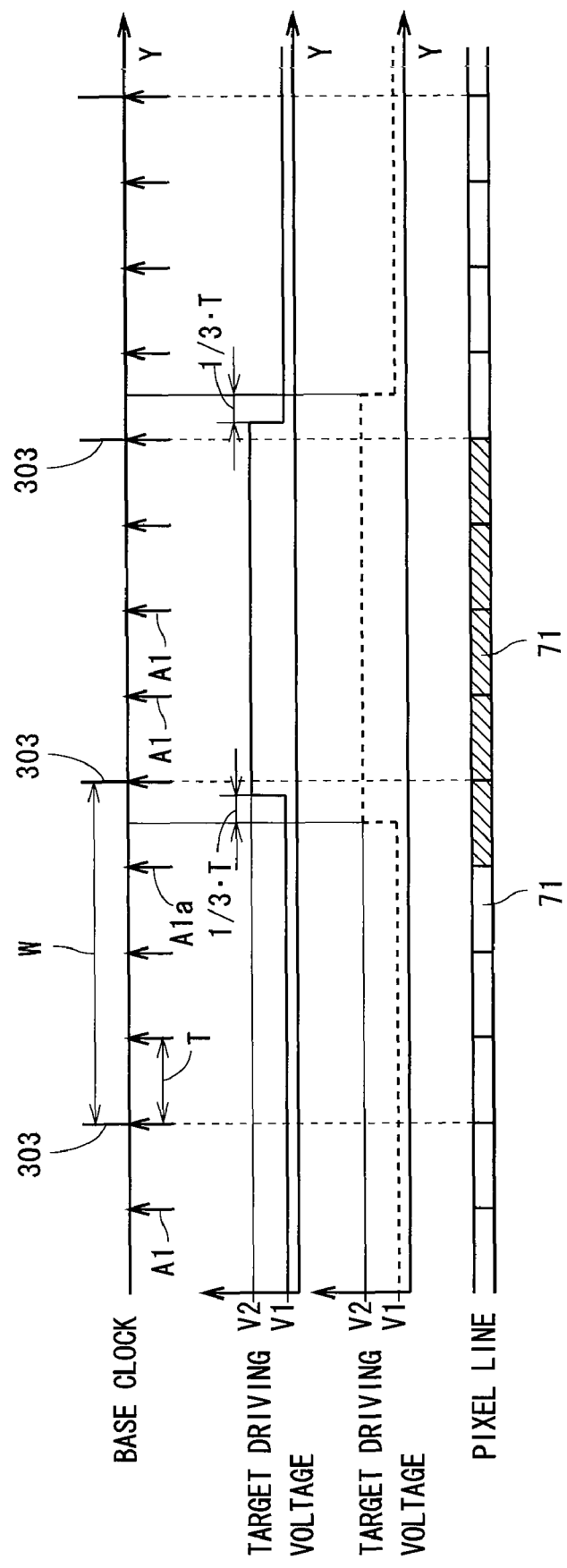
FIG. 15 is a view for explaining a linewidth correction shift amount.

FIG. 15 is a view for explaining a linewidth correction shift amount in the correction table. The linewidth correction shift amount is used for correcting displacement of writing which depends on the combination of two pixel values in adjacent two pixel groups. For example, in a case where the pixel value changes from 1 to 2 in the pixel value-change point, (+(⅓)T) which represents that the transition position of the output light amount (e.g., the position depending on a rise time of the output light amount) outputted from the light modulator element 461 is made to move by ⅓ times the reference distance T on the front side in the relative movement direction of the irradiation position, is specified by referring to Table 1. Thus, displacement of the position of the border between the area corresponding to the pixel group of the pixel value 1 and the area corresponding to the pixel group of the pixel value 2 on the substrate 9 is corrected (i.e., displacement of writing of the pixel groups is corrected). In a case where the pixel value changes from 2 to 1 in the pixel value-change point, (−(⅓)T) which represents that the transition position of the output light amount (e.g., the position depending on a fall time of the output light amount) outputted from the light modulator element 461 is made to move by ⅓ times the reference distance T on the rear side in the relative movement direction of the irradiation position, is specified by referring to Table 1. Thus, displacement of the position of the border between the area corresponding to the pixel group of the pixel value 2 and the area corresponding to the pixel group of the pixel value 1 on the substrate 9 is corrected.

In the second part of FIG. 15, shift by the linewidth correction shift amount in Table 1 is added to the change of the target driving voltage in the middle part of FIG. 14 (the change of the target driving voltage in the middle part of FIG. 14 is shown by a dashed line in the third part of FIG. 15, and the same is applied in the forth part of FIG. 16 discussed later). As shown in the lowest part of FIG. 15, since pixel values of adjacent three pixel groups change to 1, 2, 1 in this order and the number of pixels in the middle pixel group of the pixel value 2 is 5, the distance where the target driving voltage of the light modulator element 461 becomes the second level driving voltage V2 in the second part of FIG. 15 is shorter than the distance corresponding to five pixels (five times the reference distance T) by ⅔ times the reference distance T, to thereby correct the width corresponding to the pixel group of the pixel value 2 in the main scan direction on the substrate 9. As discussed above, the linewidth correction shift amount in the correction table is substantially used for correcting the width (linewidth) corresponding to a pixel group of each pixel value in the main scan direction on the substrate 9.

Figure 16:
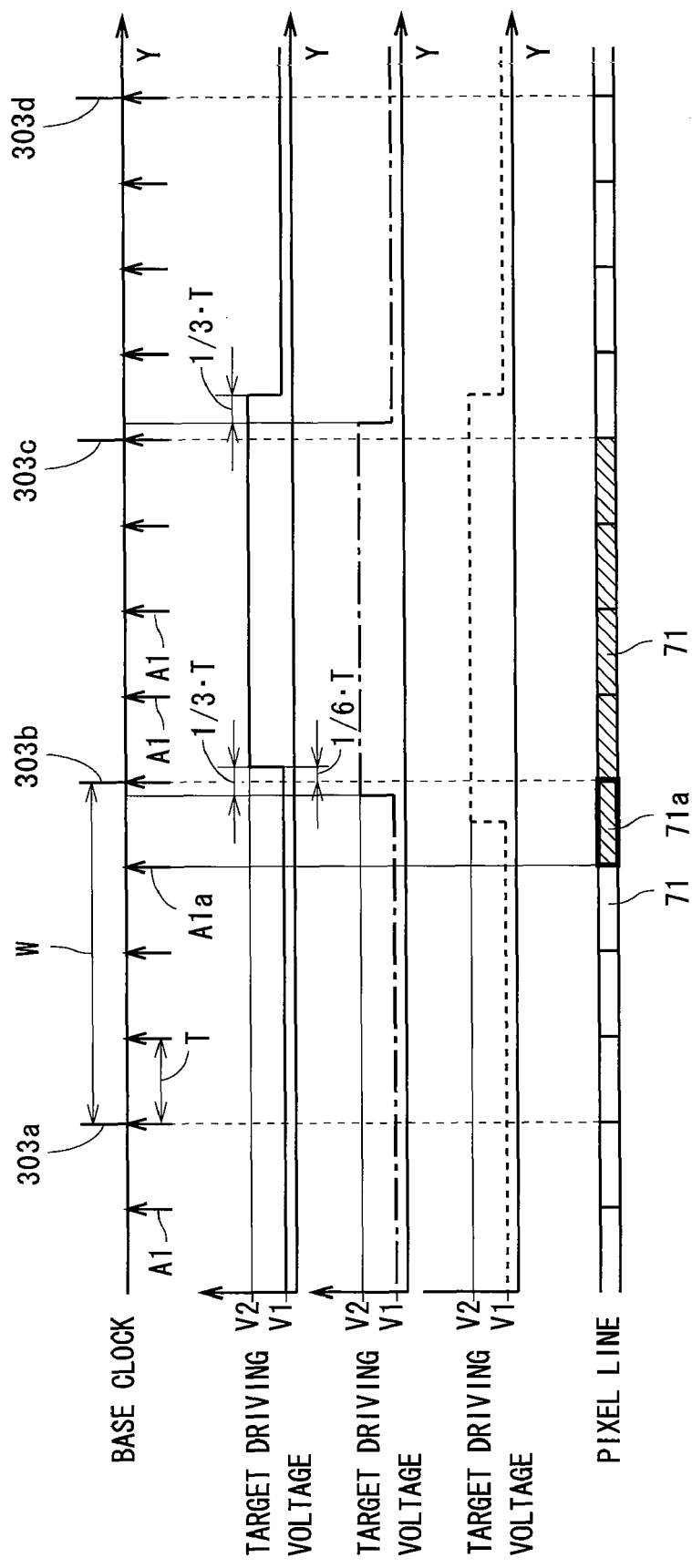
FIG. 16 is a view for explaining a positional correction shift amount.

FIG. 16 is a view for explaining a positional correction shift amount in the correction table. The positional correction shift amount is used for correcting displacement (displacement in the main scan direction) between the irradiation position of the light modulator element 461 and the irradiation position of another light modulator element 461. The positional correction shift amount is set to each light modulator element 461, and the same value is set to all the combinations of two pixel values of pixels. For example, if the shift by the positional correction shift amount (+(⅓)T) in Table 1 is further added to the example of the second part of FIG. 15 (the same is shown by a one-dot chain line in the third part of FIG. 16), in any cases where the pixel value changes from 1 to 2 in the pixel value-change point and the pixel value changes from 2 to 1 in the pixel value-change point, the transition position of the output light amount outputted from the light modulator element 461 further moves on the front side ((+Y) side) in the relative movement direction of the irradiation position, by ⅓ times the reference distance T, as shown in the second part of FIG. 16.

In this case, the position where the target driving voltage of the light modulator element 461 is changed from the first level driving voltage V1 to the second level driving voltage V2 (i.e., the transition position of the output light amount) moves relatively to a position of the pixel value-change point from a pixel 71 of the pixel value 1 to a pixel 71 of the pixel value 2 in the pixel line shown in the lowest part of FIG. 16 (the position is a reference position A1a of a pixel 71a), by the distance which is larger than the reference distance T and is equal to or smaller than twice the reference distance T, and the shift amount of the transition position of the output light amount outputted from the light modulator element 461 exceeds the distance corresponding to one pixel. Thus, the transition timing of the output light amount relative to the pixel value-change point (the reference position A1a) from the pixel 71 of the pixel value 1 to the pixel 71 of the pixel value 2 is included in a base clock period next to the base clock period to which the pixel value-change point belongs. As discussed earlier, since the count number of the delay clock 304 in the counter 614 of FIG. 5 is reset every time the base clock 303 is inputted, change of the target driving voltage shown in the second part of FIG. 16 cannot be performed on the basis of the pixel line shown in the lowest part of FIG. 16 in the image recording apparatus 1 of FIG. 1.

As discussed in the following description in detail, a process of moving (delaying) the pixel value-change point from the pixel value 1 to the pixel value 2 by one pixel is performed by altering the pixel value of the pixel 71a which is surrounded by the thick-lined rectangle in the lowest part of FIG. 16, to 0, and a process of obtaining a shift amount which is modified relatively to the pixel value-change point after moving is performed in the image recording apparatus 1.

After the correction table is prepared in the image recording apparatus 1, the pixel count between the base clocks (or the set distance) which is used in an image recording operation is determined by the main operation part 62 of FIG. 7 (Step S12), the pixel count between the base clocks is inputted to the output data generating part 633, and the reference position address table 6172 according to the pixel count between the base clocks is inputted to the driving element 61. Actually, in the process of Step S12, it is confirmed whether the pixel count between the base clocks which is set in the image recording apparatus 1 in advance (hereinafter, referred to as "initial pixel count between the base clocks") is changed or not, and in a case where it is confirmed the initial pixel count between the base clocks is changed, the pixel count between the base clocks which is actually used is determined. In the present operation, the initial pixel count between the base clocks is set to 5, and it is changed to 4 by a predetermined process. The detailed process of Step S12 will be described later.

Subsequently, a process for generation of the pixel processing table 6311 and the modified shift amount table 6171 is performed in the main operation part 62. First, in the excessive shift amount detecting part 621 of FIG. 7, the normal shift amount, the linewidth correction shift amount and the positional correction shift amount are added (summed) in each combination of the two pixel values in Table 1 to obtain a total shift amount shown in Table 2 (Step S13).

TABLE 2

|  | Adjacent pixel value | | | |
|---|---|---|---|---|
|  | 1 | 1 | 2 | 2 |
|  | Present pixel value | | | |
|  | 1 | 2 | 1 | 2 |
| Total shift amount | +(⅝)T | +(⅞)T | +(½)T | +(⅝)T |

It is confirmed whether or not, in all the combinations of the different two pixel values (in Table 2, the combination of the pixel value 1 and the pixel value 2 and the combination of the pixel value 2 and the pixel value 1), there is a combination where the total shift amount excesses the reference distance T corresponding to one pixel value. In the present operation, it is confirmed that, only in the combination of the adjacent pixel value 1 and the present pixel value 2, the total shift amount is (+7/6) times the reference distance T and is larger than the reference distance T and equal to or smaller than twice the reference distance T. In the table generating part 622, generated is a pixel processing table 6311 shown in Table 3 where the "processed pixel count" (i.e., the number of processed pixels) in the combination of the adjacent pixel value 1 and the present pixel value 2 is (+1) and the "processed pixel count" in the other combinations is 0.

TABLE 3

| | Adjacent pixel value | | | |
|---|---|---|---|---|
| | 1 | 1 | 2 | 2 |
| | Present pixel value | | | |
| | 1 | 2 | 1 | 2 |
| Processed pixel count | 0 | +1 | 0 | 0 |

The processed pixel count represents a movement amount of the pixel value-change point between adjacent two pixel groups. In the pixel processing table 6311 of Table 3, since the processed pixel count relative to the pixel value-change point where the pixel value changes from 1 to 2 is (+1), processing of the pixel line, which delays the pixel value-change point by one pixel, is instructed. The processed pixel count relative to the other combinations of the pixel values is 0 and processing of pixel is not instructed. The pixel processing table 6311 is inputted to the memory 631 in the FPGA control element 63 of FIG. 7 and stored therein (Step S14). In a case where the total shift amount is larger than α times the reference distance T (where α is an integer which is 1 or more) and equal to or smaller than (α+1) times the reference distance T, the processed pixel count is α.

In the combination of the two pixel values where the total shift amount is larger than the reference distance T and the processed pixel count is other than 0, a value which is a product by multiplying the processed pixel count corresponding to the combination by the reference distance T is obtained in the table generating part 622, and a value which is a difference by subtracting the value from the total shift amount (i.e., a value obtained by multiplying a decimal part of β in the total shift amount represented as β times the reference distance T by the reference distance T) is obtained as a modified shift amount. In the combinations of the two pixel values in each of which the total shift amount is smaller than the reference distance T, the total light amount is used as a modified shift amount. Therefore, in the example of Table 2, the modified shift amount is (+⅙) times the reference distance T in the combination of the adjacent pixel value 1 and the present pixel value 2, and the total shift amount is used as the modified shift amount in each of the other combinations of the two pixel values, to generate a modified shift amount table 6171 shown in Table 4. The modified shift amount table 6171 is inputted to the memory 617 in the driving element 61 of FIG. 7 and stored therein (Step S15). In a case where there is a combination of the same two pixel values where the total shift amount excesses the reference distance T, a value obtained by multiplying a decimal part of β in the total shift amount which is represented as β times the reference distance T by the reference distance T is treated as a modified shift amount. Actually, the modified shift amount is changed to a value which is close to an integral multiple of the shift amount corresponding to the resolution of the delay clock 304, and the shift delay number which is the count number of the delay clock 304 can be given in the driving element 61 as discussed earlier.

TABLE 4

| | Adjacent pixel value | | | |
|---|---|---|---|---|
| | 1 | 1 | 2 | 2 |
| | Present pixel value | | | |
| | 1 | 2 | 1 | 2 |
| Modified shift amount | +(⅚)T | +(⅙)T | +(½)T | +(⅚)T |

After the pixel processing table 6311 and the modified shift amount table 6171 are prepared as discussed above, movement of the substrate 9 in the main scan direction at a constant speed is started (Step S16) and data of the target image which is stored in a not-shown image memory in the control part 6 is inputted to the modulator control part 60. As discussed earlier, the pixel line data 691 corresponding to each pixel line processing part 632 is inputted to the pixel line processing part 632 in the modulator control part 60 of FIG. 7.

As shown in the lowest part of FIG. 16, in a case where pixel values of adjacent (a series of) three pixel groups are respectively 1, 2, 1, the processed pixel count to the pixel value-change point between the first white pixel group (on the left side of FIG. 16) of the pixel value 1 and a hatched pixel group of the pixel value 2 is obtained as (+1) by referring to the pixel processing table 6311, and the pixel value of the first pixel 71a in the pixel group of the pixel value 2 is change to 1 to move (delay) the pixel value-change point. The processed pixel count to the pixel value-change point between the pixel group of the pixel value 2 and the next pixel group (on the right side of FIG. 16) of the pixel value 1 is obtained as 0, and the pixel value-change point is not moved. Since the processed pixel count between pixels 71 having the same pixel values is 0 as shown in Table 3 and processing of pixel is not performed, the processed pixel count only influences the pixel value-change point.

Figure 17:
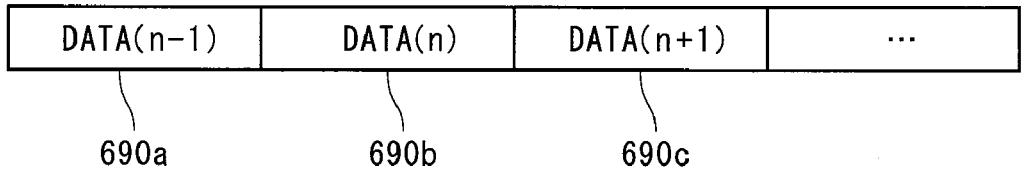
FIG. 17 is a view showing a data structure of a pixel line.

Actually, in the pixel processing part 632, movement of each pixel value-change point is performed by changing the lengths of run-lengths in the data of pixel line which is inputted as the run-length data as shown in FIG. 17. In FIG. 17, one run-length is shown by a rectangle (reference signs 690a, 690b, 690c).

Looking at a pixel value-change point between the run-length 690b described as "DATA(n)" and the run-length 690c which is described as "DATA(n+1)" in FIG. 17 and adjacent on the rear side of the run-length 690b (the pixel value-change point is hereinafter referred to as "target pixel value-change point"), first, the processed pixel count at the target pixel value-change point is obtained by referring to the pixel processing table 6311 by a pixel value of the run-length 690b and a pixel value of the adjacent run-length 690c. Modification conditions of the pixel line data 691 shown in Table 5 are stored in the pixel ling processing part 632 in advance. For example, in a case where the processed pixel count at the pixel value-change point between the run-length 690a, which is described as "DATA(n−1)" and adjacent on the front side of the run-length 690b, and the run-length 690b is 0 (the processed pixel count is described as "processed pixel count (with regard) to DATA(n−1)" in Table 5) and the processed pixel count at the target pixel value-change point is also 0 (the processed pixel count is described as "processed pixel count to DATA (n)" in Table 5), an amount of change of the length of the run-length 690b is 0 (the amount of change is described as "actual processing to DATA(n)" in Table 5).

TABLE 5

| Processed pixel count to DATA (n − 1) | Processed pixel count to DATA (n) | Actual processing to DATA (n) |
|---|---|---|
| 0 | 0 | 0 |
| 0 | +1 | +1 |
| +1 | 0 | −1 |
| +1 | +1 | 0 |

As shown in Table 5, in a case where the processed pixel count at the pixel value-change point between the run-length 690*a* and the run-length 690*b* is obtained as 0 and the processed pixel count at the target pixel value-change point is obtained as (+1), the amount of change of the length of the run-length 690*b* is (+1) (i.e., the run-length 690*b* is made longer by one pixel). In a case where the processed pixel count at the pixel value-change point between the run-length 690*a* and the run-length 690*b* is obtained as (+1) and the processed pixel count at the target pixel value-change point is obtained as 0, the amount of change of the length of the run-length 690*b* is (−1) (i.e., the run-length 690*b* is made shorter by one pixel) because the run-length 690*a* is extended by (+1) and the target pixel value-change point is delayed by one pixel. Further, In a case where the processed pixel count at the pixel value-change point between the run-length 690*a* and the run-length 690*b* is obtained as (+1) and the processed pixel count at the target pixel value-change point is obtained as (+1), the amount of change of the length of the run-length 690*b* is 0 because the run-length 690*a* is extended by (+1) and the target pixel value-change point is already delayed by one pixel.

In the example shown in the lowest part of FIG. 16, in a case where the number of pixels (the lengths of run-lengths) in the central pixel group among the adjacent three pixel groups is 5, since the processed pixel count at the pixel value-change point between the first white pixel group of the pixel value 1 (on the left side of FIG. 16) and the hatched pixel group of the pixel value 2 is (+1) and the processed pixel count at the pixel value-change point between the pixel group of the pixel value 2 and the next pixel group of the pixel value 1 (on the right side of FIG. 16) is 0, the amount of change of the number of pixels (the lengths of run-lengths) in the pixel group of the pixel value 2 is (−1) and the number of pixels in the pixel group of the pixel value 2 is change to 4.

As discussed above, in the image recording apparatus 1, the data of the target image is inputted to the pixel line processing part 632 as the run-length data, and the lengths of run-lengths in the run-length data are changed in moving each pixel value-change point, to thereby easily perform movement of the pixel value-change point and process the pixel line data 691 (Step S17). The data of the target image may be represented in a format other than the run-length data, depending on a design of the pixel line processing part 632.

In parallel with processing of the pixel line data in the pixel line processing part 632, (part of) the pixel line data after processing is decoded in the output data generating part 633 and partitioned every pixels of pixel count between the base clocks, to generate converted pixel data 692 which represents a number of a pixel whose pixel value changes from the immediately prior pixel in pixels of the pixel count between the base clocks and a pixel value of the pixel (i.e., the changing pixel number and the pixel value of changing pixel) as discussed earlier.

For example, in the lowest part of FIG. 16, assuming that the pixel value of the pixel 71*a* is altered to 1 (the pixel 71*a* becomes a white pixel) by the process of the pixel line processing part 632, the changing pixel number and the pixel value of changing pixel of the converted pixel data 692 which is referred in writing corresponding to the base clock 303*a*, are both 1 because a pixel value-change point does not exist in the four pixels 71 between the base clocks 303*a*, 303*b* (also in a case where there is no pixel value-change point, the changing pixel number is 1 and the pixel value of changing pixel is the same as a pixel value of the last pixel in the immediately prior base clock period, as discussed earlier). The changing pixel number and the pixel value of changing pixel of the converted pixel data 692 which is referred in writing corresponding to the base clock 303*b*, are respectively 1 and 2 because a pixel value-change point from the pixel value 1 to the pixel value 2 exists in the first pixel (the first reference position) among the four pixels 71 between the base clocks 303*b*, 303*c*. Further, the changing pixel number and the pixel value of changing pixel of the converted pixel data 692 which is referred in writing corresponding to the base clock 303*c*, are both 1 because a pixel value-change point from the pixel value 2 to the pixel value 1 exists in the first pixel (the first reference position) among the four pixels 71 between the base clocks 303*c*, 303*d*.

Then, the converted pixel data 692 is outputted to the driving element 61 in response to the base clock 303 which is generated every time when the substrate 9 moves by the set distance corresponding to the pixel count between the base clocks (Step S18). In the driving element 61, driving voltage data 301 and shift delay number data 302 are generated from the converted pixel data 692 (Step S18*a*), and a pattern is written on the substrate 9 by controlling the light modulator element 461 while shifting the transition position of the output light amount outputted from the light modulator element 461 (Step S19).

At this time, in writing corresponding to the base clock 303*b* in the uppermost part of FIG. 16, the reference position address (0 in the present operation) corresponding to the first pixel is specified on the basis of the converted pixel data 692 where the changing pixel number and the pixel value of changing pixel are 1 and 2, and the modified shift amount is specified as $(+(\frac{1}{6})T)$ with using the immediately prior "pixel value of change pixel" and the present "pixel value of change pixel". Thus, the shift delay number data 302 is obtained as the count number corresponding to the distance $(+(\frac{1}{6})T)$ to achieve change of the target driving voltage shown in the second part of FIG. 16. The target driving voltage alter changing is made to the second level driving voltage V2 on the basis of the pixel value of changing pixel of the converted pixel data 692.

Actually, generation of the converted pixel data 692 and input of the converted pixel data 692 to the driving element 692 in Step S18 and writing of a pattern on the basis of the converted pixel data 692 in Steps S18*a*, S19, are repeated until the whole image representing the target image is recorded on the substrate 9 (Step S20). After the whole image representing the target image is recorded, movement of the substrate 9 in the main scan direction is stopped, to complete the operation for recording an image on the substrate 9 (Step S21).

Figure 18:
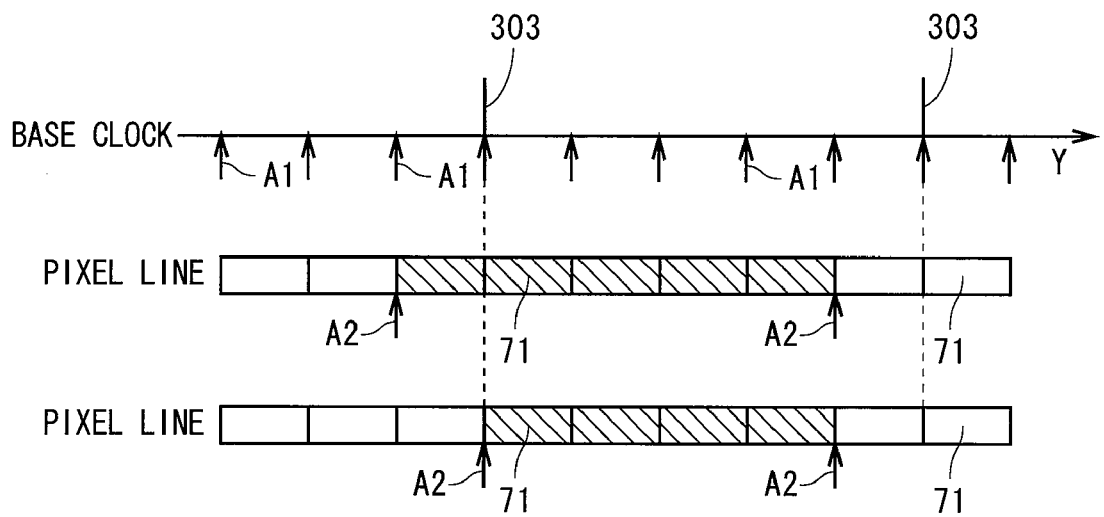
FIGS. 18 and 19 are views each showing base clocks and pixel lines.
Figure 19:
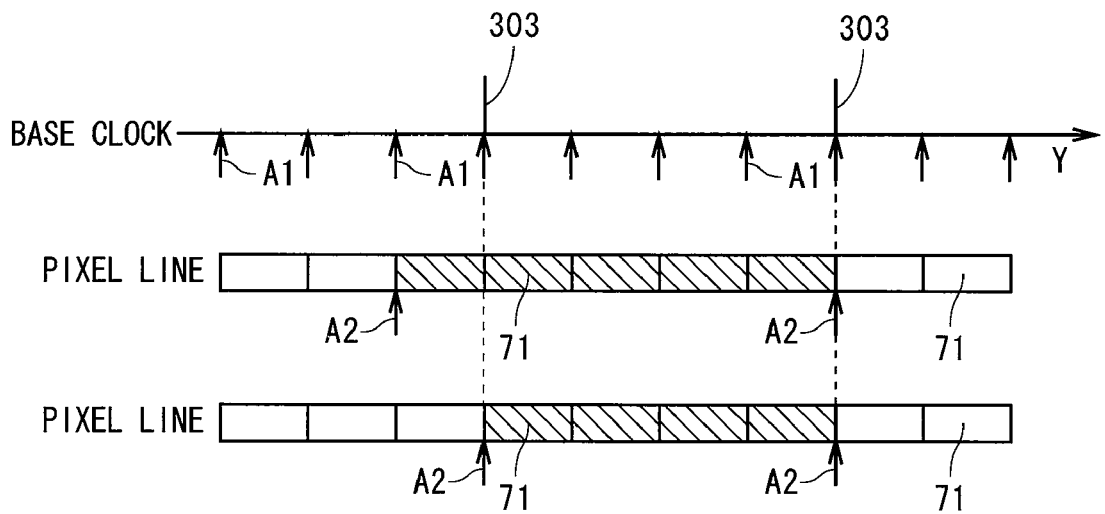

Next, discussion will be made on an operation for determining the pixel count between the base clocks in Step S12. FIG. 18 is a view showing base clocks 303 and pixel lines. The upper part of FIG. 18 represents the base clocks 303, the middle part represents a pixel line before moving of pixel value-change points, and the lower part represents a pixel line after moving of the pixel value-change points (the same is applied in FIG. 19 discussed later). The positions of the pixel value-change points are indicated by arrows A2 in the middle and lower parts of FIG. 18.

As shown in the upper and middle parts of FIG. 18, in a case where the initial pixel count between the base clocks is set to 5, the data of the target image is generated as data where the number of pixels in each pixel group which is a series of pixels having the same pixel values in each pixel line is equal to or larger than 5 (the logical minimum linewidth can be considered as the width corresponding to 5 pixels), and it is therefore possible to appropriately record an image in the image recording apparatus 1 where transition of the output light amount outputted from the light modulator element 461 is permitted only once in the base clock period. In this time, if the process of delaying the pixel value-change point by one pixel is performed in processing of the pixel line data in Step S17 of FIG. 13, a pixel group where the number of pixels is 4 (a group of hatched pixels 71) is generated and the two pixel value-change points exist in the base clock period as shown in the lower part of FIG. 18.

Therefore, first, in the correction table of Table 1, assuming that one pixel value is the target pixel value, a value which is a difference by subtracting the minimum value of linewidth correction shift amounts in a plurality of combinations in each of which the present pixel value is the target pixel value, from the maximum value of linewidth correction shift amounts in a plurality of combinations of two pixel values in each of which the adjacent pixel value is the target pixel value, is obtained as the maximum amount of narrowing in the main operation part 62. A value obtained by subtracting the maximum value of the maximum amounts of narrowing in the case where respective pixel values are the target pixel values, from the distance corresponding to the initial pixel count between the base clocks (i.e., the set distance corresponding to the initial pixel count between the base clocks) (the above value can be regarded as the physical minimum linewidth) is further divided by the reference distance T to obtain a calculated value, and an integer part of the calculated value is obtained as the minimum width of pixel group.

In the example of Table 1, the maximum value of the linewidth correction shift amounts in the case that the pixel value 1 is the adjacent pixel value is $(+\frac{1}{3})$ times the reference distance T, the minimum value of the linewidth correction shift amounts in the case that the pixel value 1 is the present pixel value is $(-\frac{1}{3})$ times the reference distance T, and a value which is obtained by subtracting $(-\frac{1}{3})$ times the reference distance T from $(+\frac{1}{3})$ times the reference distance T (a value $(\frac{2}{3})$ times the reference distance T) becomes the maximum value of the maximum amounts of narrowing relative to all the pixel values. A value obtained by subtracting the maximum value of the maximum amounts of narrowing from 5 times the reference distance T which corresponds to the initial pixel count between the base clocks (a value (13/3) times the reference distance T) is further divided by the reference distance T, and the integer part 4 of the calculated value is obtained as the minimum width of pixel group. Then, as shown in the upper part of FIG. 19, the pixel count between the base clocks is determined to 4 which is smaller than the initial pixel count between the base clocks. Thus, even in the case that the process of delaying the pixel value-change point by one pixel is performed in processing of the pixel line data and the pixel group where the number of pixels is 4 (the group of hatched pixels 71) is generated as shown in the lower part of FIG. 19, it is possible to prevent existence of the two pixel value-change points in the base clock period.

As discussed above, in the main operation part 62, in a case where the number of pixels of the minimum pixel group where the number of pixels is smallest out of a plurality of pixel groups each of which is a series of pixels in the line direction having the same pixel values in the pixel line after processing, is smaller than the initial pixel count between the base clocks, the process of shortening the set distance to the distance corresponding to the number of pixels of the minimum pixel group is performed. As discussed earlier, the converted pixel data 692 is generated by the output data generating part 633 where the pixel count between the base clocks is 4, and pattern writing by modulation of the light modulator element 461 is thereby performed without existence of the two pixel value-change points in the base clock period.

As discussed above, the total shift amount is obtained by referring to each combination of two pixel values in the correction table in the image recording apparatus 1 of FIG. 1, and thereby, the shift amount (the shift amount before modification) for shifting the transition position of the output light amount outputted from each light modulator element 461 is substantially obtained with respect to each pixel value-change point of the pixel line corresponding to the light modulator element 461, in order to correct displacement of writing of the pixel group. With respect to a combination whose total shift amount is larger than the reference distance T, an integer part of β in the total shift amount represented as β times the reference distance T is made to the processed pixel count, and a value obtained by multiplying the reference distance T by a decimal part of β is made to the modified shift amount to create the pixel processing table 6311 and the modified shift amount table 6171. Thus, in the actual image recording, in a case where the above shift amount (the shift amount before modification) at each pixel value-change point excesses the width corresponding to one pixel in the main scan direction on the substrate 9, a pixel value(s) of a pixel(s) in the target image is altered so that the pixel value-change point moves in the line direction by the number of pixels of an integer part of a calculated value which is obtained by dividing the shift amount by the width and the shift amount corresponding to the pixel value-change point is modified to a value equivalent to a decimal part. The spatial light modulator 46 is controlled on the basis of the target image after alteration and the shift amount after modification in synchronization with the main scan mechanism 25, and it is therefore possible to shift the transition position of the output light amount outputted from the light modulator element 461 in excess of the distance corresponding to one pixel in recording an image on the substrate 9 and to record an image with accuracy.

In the image recording apparatus 1, a plurality of correction tables each of which represents a shift amount of a pixel value-change point before moving relative to each of a plurality of combinations of two pixel values, are prepared correspondingly to all the light modulator elements 461 in advance, and a plurality of pixel processing tables 6311 each of which represents a movement amount of a pixel value-change point relative to each of combinations of two pixel values and a plurality of modified shift amount tables 6171 each of which represents a shift amount (a modified shift amount) where a value of a correction table relative to each combination of two pixel values is modified, are generated from a plurality of correction tables by the main operation part 62. The pixel processing table 6311 corresponding to each pixel line is referred in the pixel line processing part 631 by a combination of two pixel values in each pixel value-change point in the pixel line, to thereby perform the process of acquiring a movement amount of the pixel value-change point and move the pixel value-change point in the line direction. The modified shift amount table 6171 corresponding to each pixel line is referred in the modified shift amount obtaining part 618 by a combination of two pixel values in each pixel value-change point in the pixel line, to thereby perform the process of obtaining the modified shift amount of the pixel value-change point. With this operation, it is possible to easily achieve shift of the transition position where the shift amount excesses the distance corresponding to one pixel in recording an image on the substrate 9 in the image recording apparatus 1.

Though it is considered that image data where each pixel value-change point is moved on the basis of the correction table in advance is created in generating data of the target image in RIP (Raster Image Processor), if the contents of the correction table are changed in this case, it is necessary to recreate the image data, to increase the time period required for processing of the image recording.

On the other hand, in the image recording apparatus 1, even in the case that the contents of the correction table are changed, since the pixel processing table 6311 and the modified shift amount table 6171 have only to be renewed (modified) as discussed above, it is possible to reduce the time period required for processing of the image recording.

As described above, in the image recording apparatus 1, since one driving element 61 and one FPGA control element 63 are provided for each of the plurality of (all the) light modulator elements 461, a group of memories 631 in a plurality of FPGA control elements 63 is considered as the first table memory for storing the plurality of pixel processing tables 6311 which respectively correspond to the plurality of light modulator elements 461 in the present preferred embodiment, and a group of memories 617 in a plurality of driving elements 61 is considered as the second table memory for storing the plurality of modified shift amount tables 6171 which respectively correspond to the plurality of light modulator elements 461. A group of pixel line processing parts 632 in the plurality of FPGA control elements 63 is considered as an image altering part for acquiring a movement amount of each pixel value-change point to move the pixel value-change point in the line direction, and a group of modified shift amount obtaining parts 618 in the plurality of driving elements 61 is considered as a shift amount obtaining part for obtaining a shift amount after modification at each pixel value-change point.

Figure 20:
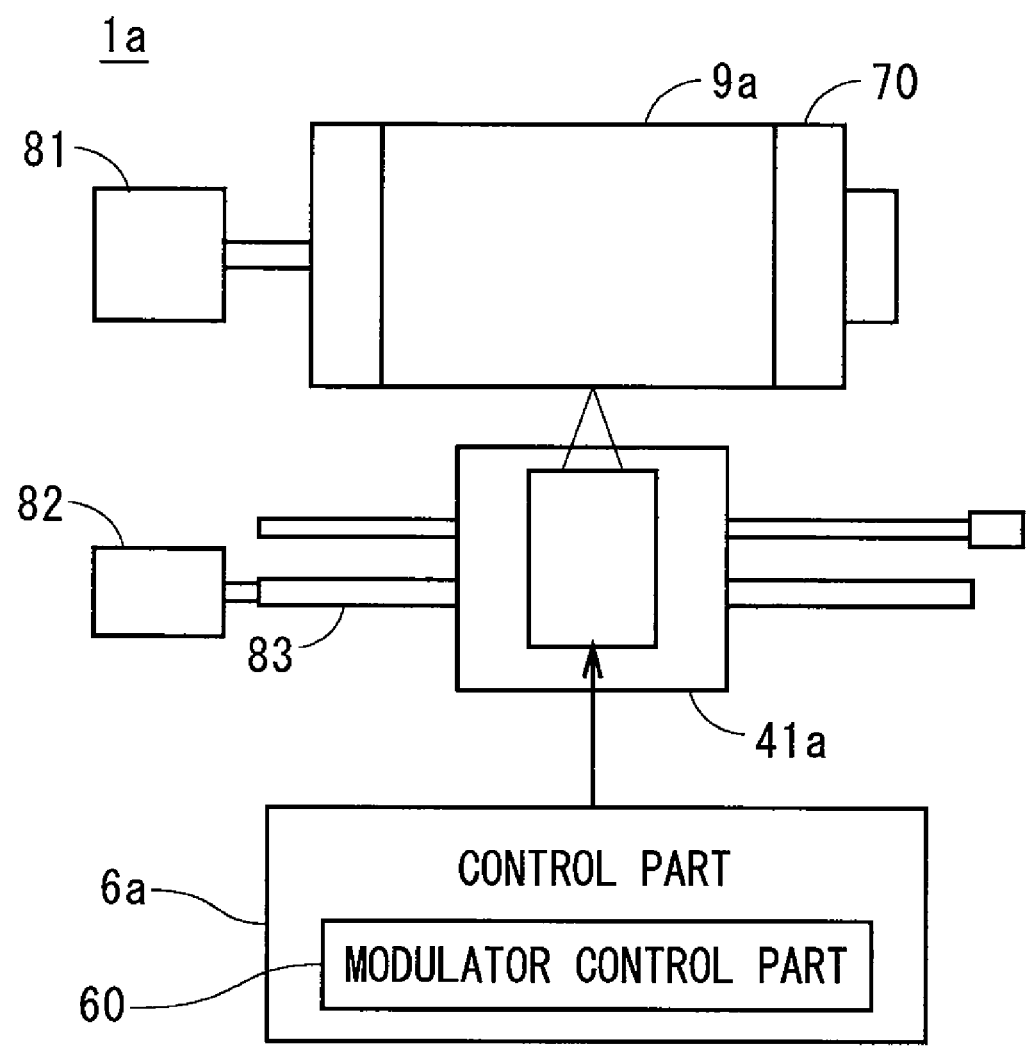
FIG. 20 is a view showing a constitution of an image recording apparatus in accordance with the second preferred embodiment.

FIG. 20 is a view showing a constitution of an image recording apparatus 1a in accordance with the second preferred embodiment of the present invention. The image recording apparatus 1a has one optical head 41a for emitting light for image recording and a holding drum 70 which is a holding part for holding a recording medium 9a on its outer surface. An image is recorded on the recording medium 9a by writing with light irradiation (exposure) of the optical head 41a. As the recording medium 9a, used are a printing plate, a film for forming the printing plate and the like, for example. A photosensitive drum for plateless printing may be used as the holding drum 70 and in this case, it is understood that the recording medium 9a corresponds to a surface of the photosensitive drum and the holding drum 70 holds the recording medium 9a as a unit.

The holding drum 70 is rotated about a central axis of its cylindrical surface by a motor 81 and the optical head 41a thereby travels relatively to the recording medium 9a at a constant speed in a main scan direction (in a direction perpendicular to an arrangement direction of positions irradiated with light from a plurality of light modulator elements later discussed). The optical head 41a is movable by a motor 82 and a ball screw 83 in a sub scan direction in parallel with a rotation axis of the holding drum 70 (orthogonal to the main scan direction), and the position of the optical head 41a is detected by an encoder (not shown). In this manner, a moving mechanism including the motors 81, 82 and the ball screw 83 moves the outer surface of the holding drum 70 and the recording medium 9a relatively to the optical head 41a having the spatial light modulator at a constant speed in the main scan direction and also, the moving mechanism moves them relatively to the optical head 41a in the sub scan direction crossing the main scan direction. The motors 81, 82 and the encoder are connected to a control part 6a, which controls the motors 81, 82 and emission of signal light from the spatial light modulator in the optical head 41a to record an image on the recording medium 9a held on the holding drum 70 by light.

Figure 21:
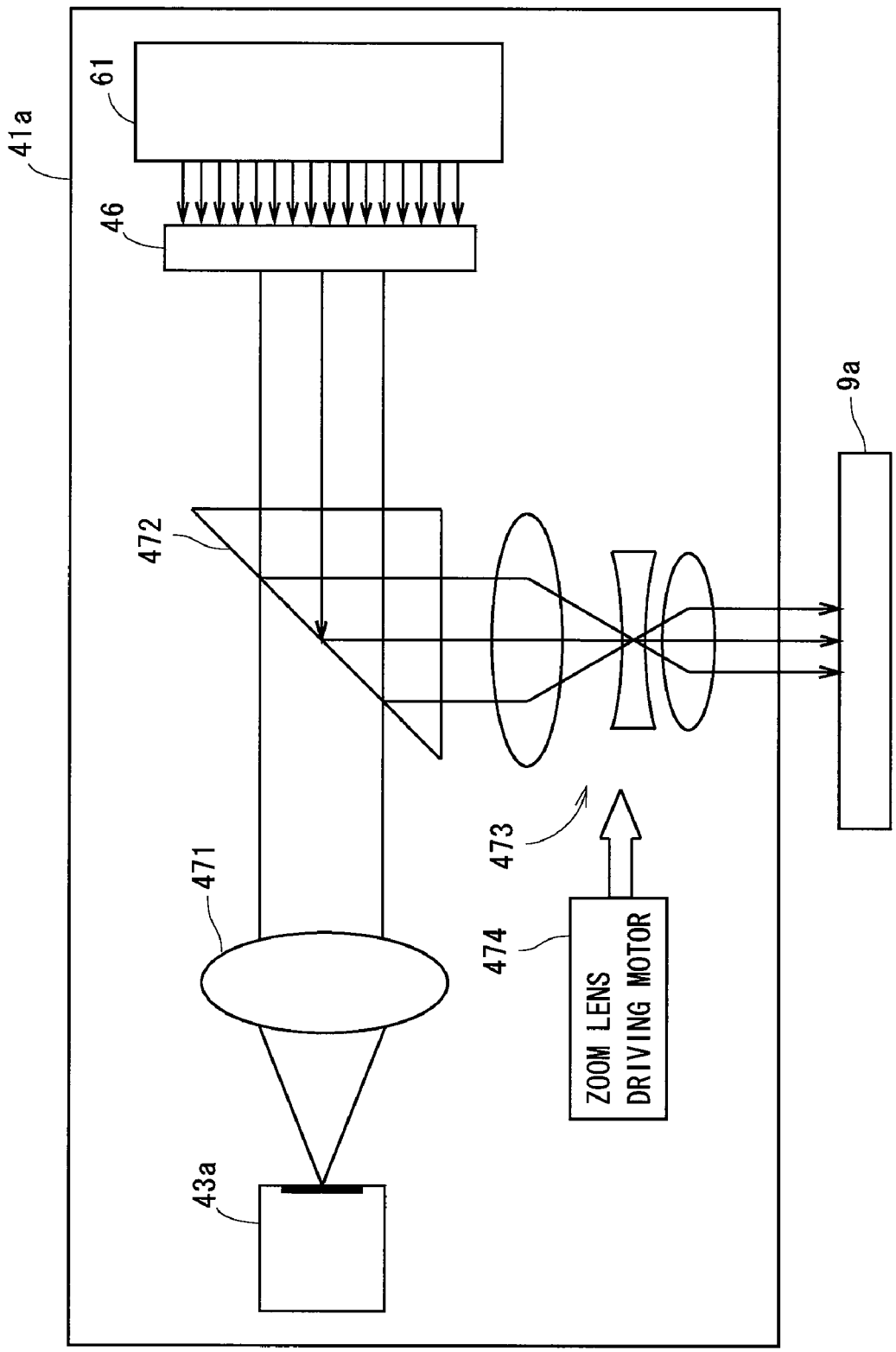
FIG. 21 is a view showing an internal constitution of an optical head.

FIG. 21 is a schematic view showing an internal constitution of the optical head 41a. In the optical head 41a, disposed are a light source 43a which is a bar-type semiconductor laser having a plurality of light emitting points arranged in a line and a spatial light modulator 46 having a plurality of light modulator elements, which are aligned, of diffraction grating type. Light from the light source 43a is guided to the spatial light modulator 46 through an illumination lenses 471 (actually consisting of a condensing lens, a cylindrical lens, and the like) and a prism 472. In this case, the light from the light source 43a is linear light (light where a section of luminous flux has a linear shape), and applied onto the plurality of light modulator elements which are arranged linearly.

Each light modulator element of the spatial light modulator 46 is controlled by a modulator control part 60 (see FIG. 20) in the control part 6a, the modulator control part 60 having the same constitution as that in the above first preferred embodiment. In FIG. 21, a driving element 61 of the modulator control part 60 is shown by a block. The zeroth order light diffracted from the light modulator element is returned to the prism 472 and the first order diffracted light is directed to different directions from the prism 472. The first order diffracted light is blocked by a not-shown light blocking part so as not to be stray light.

The zeroth order light from each light modulator element is reflected by the prism 472 and directed to the recording medium 9a, which is located outside the optical head 41a, through a zoom lens 473, and a plurality of spot images of the light modulator elements are formed on the recording medium 9a so as to be arranged in the sub scan direction. The magnification of the zoom lens 473 is changeable by a zoom lens driving motor 474 and the resolution of the image to be recorded is thereby changed.

Also in the image recording apparatus 1a of FIG. 20, an image is recorded on the recording medium 9a by the same operation as that in the image recording apparatus 1 of FIG. 1. In this time, a shift amount for shifting the transition position of the output light amount outputted from each light modulator element is obtained with respect to each pixel value-change point in the pixel line corresponding to the light modulator element, in order to correct displacement of writing of the pixel group. In a case where the above shift amount excesses the width corresponding to one pixel in the main scan direction on the recording medium 9a, a pixel value(s) of a pixel(s) in the target image is altered so that the pixel value-change point moves by the number of pixels of an integer part of a calculated value which is obtained by dividing the shift amount by the width and the shift amount corresponding to the pixel value-change point is modified to a value equivalent to a decimal part of the calculated value. The spatial light modulator 46 is controlled on the basis of the target image after alteration and the shift amount after modification while moving the irradiation position on the recording medium 9a, and it is therefore possible to shift the transition position of the output light amount outputted from the light modulator element in excess of the distance corresponding to one pixel in recording an image on the recording medium 9a and to record the image with accuracy.

Though the preferred embodiments of the present invention have been discussed above, the present invention is not limited to the above-discussed preferred embodiments, but allows various variations.

Figure 22:
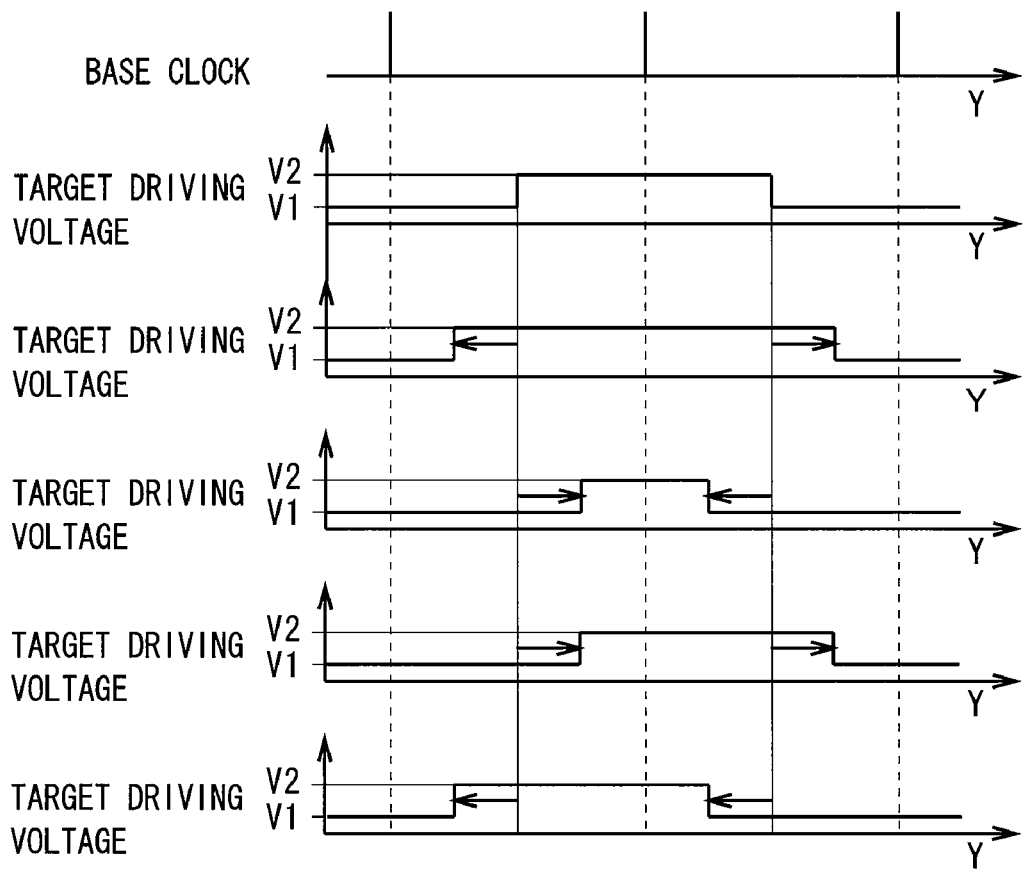
FIG. 22 is a view showing another example of linewidth correction shift amounts and positional correction shift amounts.
Figure 23:
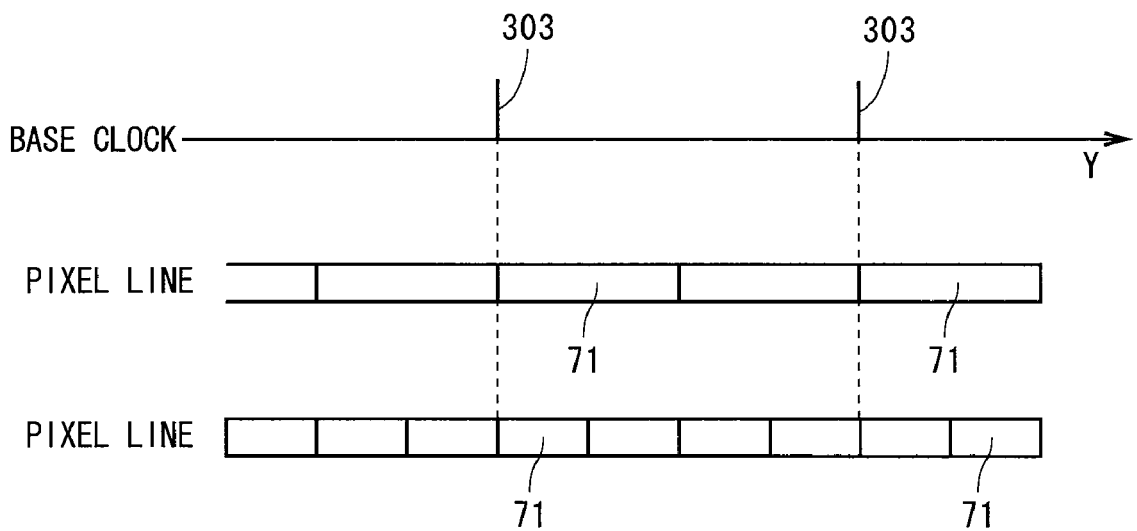
FIG. 23 is a view showing another example of the pixel count between base clocks.

In the example of FIG. 15, though discussion is made on the example where the distance in which the target driving voltage is made to the second level driving voltage V2 corresponding to the pixel value 2 in the light modulator element 461, is made shorter (see the fourth part of FIG. 22), the linewidth correction shift amounts may be determined in the correction table so that the distance in which the target driving voltage is made to the second level driving voltage V2 becomes longer, as shown in the third part of FIG. 22. In the image recording apparatuses 1, 1a, the transition position of the light modulator element 461 may be made to shift on the rear side in the travelling direction of the irradiation position as shown in the lowermost part of FIG. 22, as well as being made to shift on the front side in the travelling direction of the irradiation position (see the fifth part of FIG. 22).

Even in this case, since the normal shift amount which is a shift amount in the case that correction of displacement of writing is not performed is set to ½ times the reference distance T and a value which is obtained by increasing or decreasing a distance (in the above preferred embodiments, the distance is the linewidth correction shift amount and the positional correction shift amount) from a half of the width corresponding to one pixel in the main scan direction on the substrate 9 or the recording medium 9a, the distance being based on displacement of writing of the pixel group, is made to a shift amount before modification (according to processing of an image), the transition position of the output light amount outputted from the light modulator element 461 can be easily moved to the both sides in the main scan direction and as a result, it is possible to record an image with accuracy.

Figure 13:
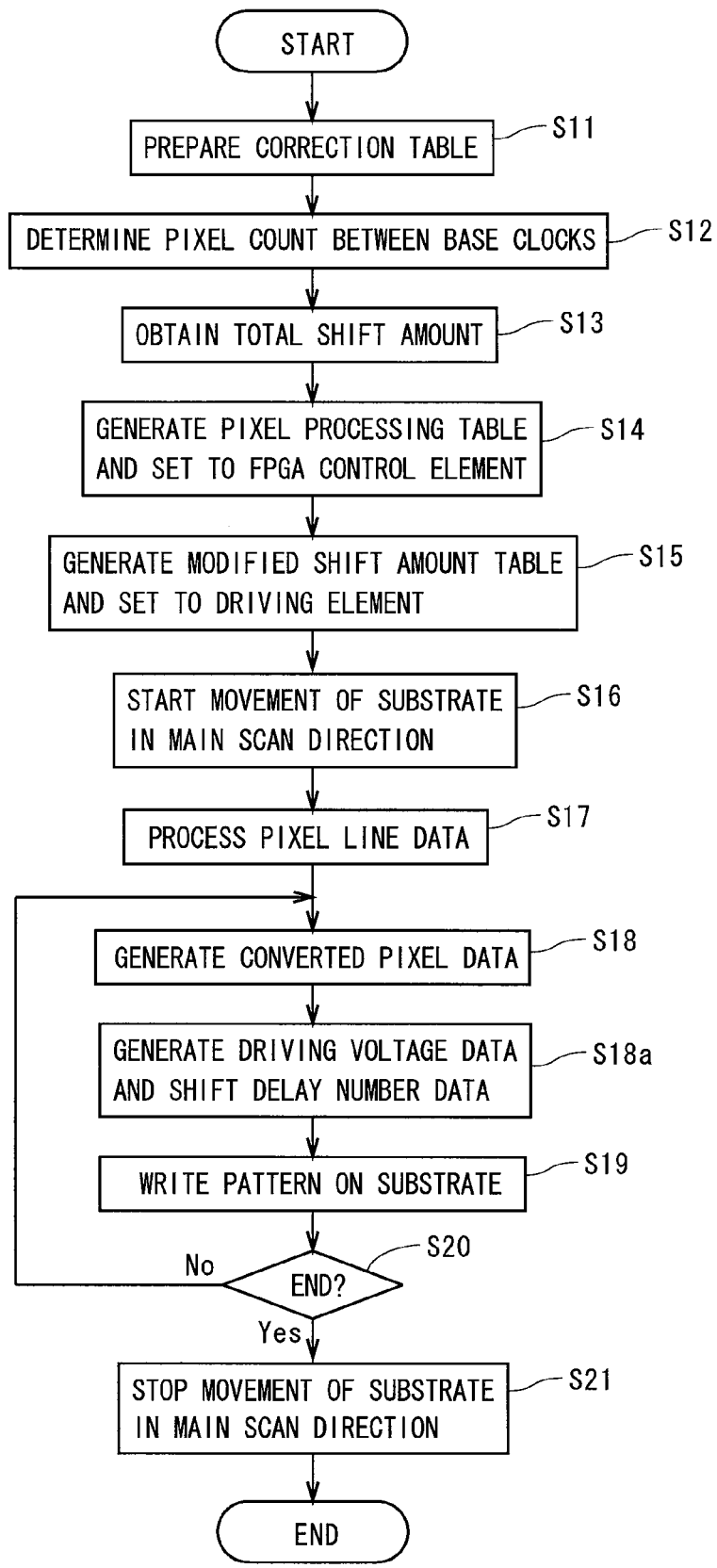
FIG. 13 is a flowchart showing an operation flow for recording an image on a substrate.

If the initial pixel count between the base clocks is 1 in the image recording apparatuses 1, 1a, the pixel count between the base clocks cannot be determined to a number which is smaller than the initial pixel count between the base clocks in the process of Step S12 in FIG. 13 and it is not possible to prevent existence of a plurality of pixel value-change points in the base clock period. Therefore, it is necessary that the initial pixel count between the base clocks is made to 4 or 2, i.e., is made to 2 or more as shown in the middle and lower pixel lines of FIG. 23 in the image recording apparatuses 1, 1a.

In the above first and second preferred embodiments, shift of the transition position where the shift amount excesses the distance corresponding to one pixel can be easily performed by referring to the pixel processing table 6311 and the modified shift amount table 6171. There may be a case where, in a case where a shift amount of each pixel value-change point excesses the distance corresponding to one pixel, if a pixel value(s) of a pixel(s) in the target image is altered so that the pixel value-change point moves by the number of pixels of an integer part of a calculated value which is obtained by dividing the shift amount by the distance and the shift amount corresponding to the pixel value-change point is modified to a value equivalent to a decimal part of the calculated value, image recording may be performed without referring to the pixel processing table 6311 and the modified shift amount table 6171.

Though the spatial light modulator 46 having the plurality of light modulator elements 461 is provided in the image recording apparatuses 1, 1a of FIGS. 1 and 20 and writing of different pixel lines included in the target image is performed by the plurality of light modulator elements 461 to thereby record an image at high speed, a light modulator having one light modulator element may be used depending on a design of an image recording apparatus. In this case, one pixel line processing part 632 and one modified shift amount obtaining part 618 are considered as the image altering part for acquiring a movement amount of each pixel value-change point to move the pixel value-change point in the line direction and the shift amount obtaining part for obtaining a shift amount after modification relative to each pixel value-change point, respectively, and writing corresponding to the plurality of pixel lines is performed by referring to the same pixel processing table 6311 and modified shift amount table 6171.

The signal light for writing is not necessarily the zeroth order light in the image recording apparatuses 1, 1a, but may be the first order diffracted light. Unlike the relative positional relation between the moving ribbons 461a which are not sagged and the fixed ribbons 461b in the above preferred embodiments, the light modulator element 461 which emits the zeroth order light in the state where the moving ribbons 461a are sagged may be used. Also in these cases, appropriate image recording can be achieved by shifting a switching timing of the light modulator element 461.

If the moving ribbons 461a and the fixed ribbons 461b can be regarded as strip-like reflective surfaces, these surfaces do not have to be in a ribbon shape in a strict meaning. For example, upper surfaces of block shapes may serve as the reflective surfaces of fixed ribbons.

The light modulator element 461 is not limited to the diffraction grating type one, but may be a liquid crystal shutter or the like. Further, the light modulator elements 461 are not limited to those that reflect light, but a laser array, for example, may perform the function as the light modulator element 461. Also in these cases, appropriate image recording can be achieved by correcting displacement of writing of each element.

A two-dimensional spatial light modulator may be used and in this case, correction for the plurality of light modulator elements 461 in the above preferred embodiments is applied to each one-dimensional array of the light modulator elements 461.

In the image recording apparatuses 1, 1a of FIGS. 1 and 20, the operation part for detecting a pixel value-change point where the total shift amount excesses the distance corresponding to one pixel and modifying the shift amount with movement of the pixel value-change point is achieved by the main operation part 62, the plurality of FPGA control elements 63, and the plurality of driving elements 61, however, the function of the operation part may be achieved only by calculation (with software) in the main operation part 62 in a case where it is not necessary to record an image at high speed.

In the image recording apparatuses 1, 1a, since a moving speed of the substrate 9 and the recording medium 9a in the main scan direction is almost constant, the concept of the distance (or the position) in the above description can be considered as a time period (or time). In this case, in the process of the operation part, a shift time period for shifting the transition timing of the output light amount outputted from each light modulator element is obtained with respect to each pixel value-change point of the pixel line corresponding to the light modulator element, in order to correct displacement of writing of the pixel group. In a case where the above shift time period excesses the time period where the irradiation position moves by the width of one pixel in the line direction, an integer part and a decimal part of a calculated value obtained by dividing the shift time period by the time period corresponding to the width of the pixel in the line direction are obtained, and a pixel value(s) of a pixel(s) in the target image is altered so that the pixel value-change point moves by the number of pixels of the integer part and the shift time period corresponding to the pixel value-change point is modified to a time period equivalent to the decimal part. Then, the spatial light modulator is controlled on the basis of the target image after alteration and the shift time period after modification, and it is therefore possible to shift the transition timing of the output light amount outputted from the light modulator element in excess of the time period corresponding to one pixel in recording an image, to record the image with accuracy.

The substrate 9 and the recording medium 9a can be moved by other techniques only if they are movable relatively to the optical heads 41, 41a. The recording medium carrying image information may be material coated with photosensitive material such as a printed circuit board or a semiconductor substrate, other material with photosensitivity, or material which responds to heat by light irradiation.

While the invention has been shown and described in detail, the foregoing description is in all aspects illustrative and not restrictive. It is therefore understood that numerous modifications and variations can be devised without departing from the scope of the invention.

This application claims priority benefit under 35 U.S.C. Section 119 of Japanese Patent Application No. 2008-85500 filed in the Japan Patent Office on Mar. 28, 2008, the entire disclosure of which is incorporated herein by reference.

What is claimed is:

1. An image recording apparatus for recording an image on a recording medium by irradiation with light, wherein
   a target image to be recorded on a recording medium contains a plurality of pixel lines each of which has a plurality of pixels arranged in a line direction, each of said plurality of pixel lines consists of a plurality of pixel groups each of which is a series of pixels having same pixel values,
   said image recording apparatus comprising:
   a light modulator having a light modulator element;
   a holding part for holding a recording medium on which said target image is recorded by signal light from said light modulator;
   a moving mechanism for moving said holding part relatively to said light modulator to move an irradiation position on a recording medium continuously in a scan direction corresponding to said line direction, said irradiation position being irradiated with light from said light modulator element;
   an operation part for obtaining a shift amount for shifting a transition position of an output light amount outputted from said light modulator element with respect to each pixel value-change point which is a position between adjacent two pixel groups in each pixel line, in order to correct displacement of writing of a pixel group, wherein in a case where said shift amount excesses a width corresponding to one pixel in said scan direction on a recording medium, said operation part alters a pixel value(s) of a pixel(s) in said each pixel line so that said each pixel value-change point moves in said line direction by a number of pixels of an integer part of a calculated value which is obtained by dividing said shift amount by said width, and said operation part modifies said shift amount corresponding to said each pixel value-change point to a value equivalent to a decimal part of said calculated value; and
   a control part for controlling said light modulator on the basis of said target image after alteration and said shift amount after modification, in synchronization with said moving mechanism.

2. The image recording apparatus according to claim 1, wherein
   said light modulator has a plurality of light modulator elements, and
   said plurality of light modulator elements perform writing of different pixel lines included in said target image.

3. The image recording apparatus according to claim 2, wherein
   each of said plurality of light modulator elements is a light modulator element of diffraction grating type in which strip-like fixed reflective surfaces and strip-like moving reflective surfaces are alternately arranged.

4. The image recording apparatus according to claim 1, wherein
   said shift amount before modification at said each pixel value-change point is obtained by referring to a combination of two pixel values of said adjacent two pixel groups in said operation part, and
   said operation part comprises:
   a first table memory for storing a pixel processing table which represents a movement amount of a pixel value-change point relative to each of a plurality of combinations of two pixel values;
   an image altering part for acquiring a movement amount of each pixel value-change point in said each pixel line by referring to said pixel processing table by a combination of two pixel values in said each pixel value-change point to move said each pixel value-change point in said line direction;
   a second table memory for storing a modified shift amount table which represents a modified shift amount relative to each of said plurality of combinations of two pixel values; and
   a shift amount obtaining part for obtaining a modified shift amount relative to said each pixel value-change point in said each pixel line by referring to said modified shift amount table by said combination of two pixel values in said each pixel value-change point.

5. The image recording apparatus according to claim 4, wherein
   said light modulator has a plurality of light modulator elements,
   said plurality of light modulator elements perform writing of different pixel lines included in said target image, and
   a plurality of pixel processing tables corresponding to said plurality of light modulator elements are stored in said first table memory and a plurality of modified shift amount tables corresponding to said plurality of light modulator elements are stored in said second table memory.

6. The image recording apparatus according to claim 5, wherein
   a plurality of correction tables each of which represents a shift amount of a pixel value-change point before moving, relatively to each of said plurality of combinations of two pixel values, are prepared correspondingly to said plurality of light modulator elements in advance, and
   said operation part generates said plurality of pixel processing tables and said plurality of modified shift amount tables from said plurality of correction tables.

7. The image recording apparatus according to claim 1, wherein a base clock is generated in said control part every time when said irradiation position on a recording medium moves in said scan direction by a constant distance corresponding to a predetermined number of pixels arranged in said each pixel line of said target image, and transition of an output light amount outputted from said light modulator element is permitted only once in a base clock period between adjacent two base clocks, and in a case where a number of pixels in a minimum pixel group, where a number of pixels is minimum, out of a plurality of pixel groups each of which is a series of pixels having same pixel values in said line direction in said target image after alteration, is smaller than said predetermined number of pixels, said operation part shortens said constant distance to a distance corresponding to said number of pixels in said minimum pixel group.

8. The image recording apparatus according to claim 1, wherein
said shift amount before modification is a value which is obtained by increasing or decreasing a distance from a half of a width corresponding to one pixel in said scan direction on a recording medium, said distance being based on displacement of writing of a pixel group.

9. The image recording apparatus according to claim 1, wherein
said target image is inputted to said operation part as run-length data, and
lengths of run-lengths in said run-length data are changed in moving said each pixel value-change point.

10. An image recording method of recording an image on a recording medium by irradiation with light while moving an irradiation position on said recording medium continuously in a scan direction, said irradiation position being irradiated with light emitted from a light modulator element of a light modulator, wherein
a target image to be recorded on said recording medium contains a plurality of pixel lines each of which has a plurality of pixels arranged in a line direction, each of said plurality of pixel lines consists of a plurality of pixel groups each of which is a series of pixels having same pixel values,
said image recording method comprising the steps of:
a) obtaining a shift amount for shifting a transition position of an output light amount outputted from said light modulator element with respect to each pixel value-change point which is a position between adjacent two pixel groups in each pixel line, in order to correct displacement of writing of a pixel group;
b) in a case where said shift amount excesses a width corresponding to one pixel in said scan direction on said recording medium, altering a pixel value(s) of a pixel(s) in said each pixel line so that said each pixel value-change point moves in said line direction by a number of pixels of an integer part of a calculated value which is obtained by dividing said shift amount by said width, and modifying said shift amount corresponding to said each pixel value-change point to a value equivalent to a decimal part of said calculated value; and
c) controlling said light modulator on the basis of said target image after alteration and said shift amount after modification, in synchronization with movement of said irradiation position.

11. The image recording method according to claim 10, wherein
said light modulator has a plurality of light modulator elements, and said plurality of light modulator elements perform writing of different pixel lines included in said target image.

12. The image recording method according to claim 11, wherein
each of said plurality of light modulator elements is a light modulator element of diffraction grating type in which strip-like fixed reflective surfaces and strip-like moving reflective surfaces are alternately arranged.

13. The image recording method according to claim 10, wherein
said shift amount before modification at said each pixel value-change point is obtained by referring to a combination of two pixel values of said adjacent two pixel groups in said step a), and
in said step b), a pixel processing table which represents a movement amount of a pixel value-change point relative to each of a plurality of combinations of two pixel values is referred by a combination of two pixel values in each pixel value-change point in said each pixel line to acquire a movement amount of said each pixel value-change point and move said each pixel value-change point in said line direction, and a modified shift amount table which represents a modified shift amount relative to each of said plurality of combinations of two pixel values is referred by said combination of two pixel values in said each pixel value-change point to obtain a modified shift amount relative to said each pixel value-change point in said each pixel line.

14. The image recording method according to claim 13, wherein
said light modulator has a plurality of light modulator elements,
said plurality of light modulator elements perform writing of different pixel lines included in said target image, and
a plurality of pixel processing tables corresponding to said plurality of light modulator elements and a plurality of modified shift amount tables corresponding to said plurality of light modulator elements are used in image recording.

15. The image recording method according to claim 14, wherein
a plurality of correction tables each of which represents a shift amount of a pixel value-change point before moving, relatively to each of said plurality of combinations of two pixel values, are prepared correspondingly to said plurality of light modulator elements in advance, and
said plurality of pixel processing tables and said plurality of modified shift amount tables are generated from said plurality of correction tables.

16. The image recording method according to claim 10, wherein
a base clock is generated every time when said irradiation position on a recording medium moves in said scan direction by a constant distance corresponding to a predetermined number of pixels arranged in said each pixel line of said target image in said step c), and transition of an output light amount outputted from said light modulator element is permitted only once in a base clock period between adjacent two base clocks, and in a case where a number of pixels in a minimum pixel group, where a number of pixels is minimum, out of a plurality of pixel groups each of which is a series of pixels having same pixel values in said line direction in said target image after alteration, is smaller than said predetermined number of pixels, said constant distance is shortened to a distance corresponding to said number of pixels in said minimum pixel group.

17. The image recording method according to claim 10, wherein
said shift amount before modification is a value which is obtained by increasing or decreasing a distance from a half of a width corresponding to one pixel in said scan direction on said recording medium, said distance being based on displacement of writing of a pixel group.

18. The image recording method according to claim 10, wherein
said target image is run-length data, and
lengths of run-lengths in said run-length data are changed in moving said each pixel value-change point in said step b).

* * * * *